(12) United States Patent
Hasegawa

(10) Patent No.: US 6,737,680 B2
(45) Date of Patent: May 18, 2004

(54) METHOD AND APPARATUS FOR FABRICATING A PHOTOCOUPLER WITH REDUCED MOUNT AREA

(75) Inventor: Yasushi Hasegawa, Yamatotakada (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/144,784

(22) Filed: May 15, 2002

(65) Prior Publication Data

US 2002/0185650 A1 Dec. 12, 2002

(30) Foreign Application Priority Data

May 15, 2001 (JP) .................................... P2001-145146

(51) Int. Cl.[7] .......................... H01L 27/15; H01L 33/00
(52) U.S. Cl. ......................... 257/82; 257/80; 257/81; 257/99; 257/100
(58) Field of Search .............................. 257/21, 80, 81, 257/82, 93, 98, 99, 100, 184, 257; 250/551

(56) References Cited

U.S. PATENT DOCUMENTS 4,745,294 A * 5/1988 Kohashi et al. ............. 250/551

FOREIGN PATENT DOCUMENTS

| JP | 4-85404 U | 7/1992 |
|----|-----------|--------|
| JP | 5-29525 A | 2/1993 |
| JP | 5-326744 A | 12/1993 |
| JP | 06112518 | * 4/1994 |
| JP | 9-83013 A | 3/1997 |

* cited by examiner

Primary Examiner—Minhloan Tran
Assistant Examiner—Tan Tran
(74) Attorney, Agent, or Firm—Birch, Stewart, Kolasch & Birch, LLP

(57) ABSTRACT

The present invention provides a photocoupler capable of reducing the mount area required to mount the photocoupler on an object by eliminating a structurally unnecessary portion, and an apparatus and method for fabricating such a photocoupler. A light-receiving device and a light-emitting device placed on a pair of lead frames are embedded in a primary mold body made of a transparent resin, and the primary mold body is embedded in a secondary mold body made of a light-shading resin, to form the photocoupler. The lead frames are bent inside the secondary mold body, and the outer side of the terminal portion of each lead frame, ranging from the bent position to the top end, is exposed at the secondary mold body.

12 Claims, 22 Drawing Sheets

METHOD AND APPARATUS FOR FABRICATING A PHOTOCOUPLER WITH REDUCED MOUNT AREA

BACKGROUND OF THE INVENTION

1. Field of the Invention

The present invention relates to a photocoupler, a method for fabricating the same, and a photocoupler fabrication apparatus. More particularly, the present invention relates to a photocoupler capable of reducing the mount area required to mount the photocoupler on an object, a method for fabricating such a photocoupler, and a photocoupler fabrication apparatus.

2. Description of the Related Art

The photocoupler is a device for removing noise generated in outputting a signal from an information processing unit such as a personal computer (PC) to external, and is soldered to a small card such as a personal computer memory card international association (PCMCIA) card connectable to an information processing unit.

A conventional photocoupler is shown in FIGS. 30 and 31. FIG. 30 is a cross-sectional side view of the photocoupler, and FIG. 31 is a schematic side view of a photocoupler fabrication apparatus.

The photocoupler, denoted by 8a, includes a pair of lead frames 83 and 84. The lead frames 83 and 84 support a light-receiving device 81 and a light-emitting device 82, respectively.

In more detail, the light-receiving device 81 and the light-emitting device 82, which are placed to face each other on the same optical axis, are attached to the lead frames 83 and 84, respectively, with bonding wires 85 such as gold wires. The light-emitting device 82 is pre-coated with a transparent silicone resin 86 for relieving stress at a junction and the like.

Transfer molding is then performed for the light-receiving device 81 and the light-emitting device 82 placed on the same optical axis, using a transparent resin. By the transfer molding, the light-receiving device 81 and the light-emitting device 82 are embedded in the light transparent resin to form a primary mold body 87.

The primary mold body 87 is then shaped by burring and tie bar cut. The lead frames 83 and 84 protrude from the sides of the primary mold body 87. The protruding lead frames 83 and 84 are then subjected to forming so that the base ends of the lead frames 83 and 84 are bent roughly at right angles with respect to the sides of the primary mold body 87.

The thus-formed primary mold body 87 is placed in a mold space D of a photocoupler fabrication apparatus (hereinafter, simply called an apparatus) 9 as shown in FIG. 31. The apparatus 9 is constructed of injection molds 91 and 92. The injection mold 91 is laterally slidable.

A light-shading resin is injected into the mold space D of the apparatus 9 with the primary mold body 87 placed therein, to form a secondary mold body 88 by the transfer molding.

The secondary mold body 88 is shaped by burring and tie bar cut. The ends of the lead frames 83 and 84 protrude from the bottom of the secondary mold body 88. Thus, the photocoupler 8a as shown in FIG. 29 is fabricated.

The thus-fabricated photocoupler 8a is mounted on a small card by soldering using the ends of the lead frames 83 and 84 protruding from the bottom of the secondary mold body 88.

With recent improvement in substrate wiring technology, objects on which devices are mounted, such as a small card, have not only enhanced in performance but also become smaller in size. In addition, the mount rate of devices to be mounted on an object, such as photocouplers, resistances, capacitors and transistors, on the object has increased. In view of these, it has become necessary to reduce the mount area required to mount each of such devices on the object.

However, to fabricate a photocoupler, consideration must be given to the following points: the double transfer molding for forming the primary mold body and the secondary mold body, the positional relationship between the lead frames supporting the light-receiving device and the light-emitting device inside the photocoupler, securing of a space for placing ends of the lead frames to be soldered to an object on which the photocoupler is mounted, and the like. The photocoupler therefore needs a body case large enough to satisfy these fabrication requirements, and thus reduction in the mount area required to mount the conventional photocoupler on an object is limited.

SUMMARY OF THE INVENTION

An object of the present invention is to provide a photocoupler capable of reducing the mount area required to mount the photocoupler on an object by eliminating a structurally unnecessary portion, and an apparatus and method for fabricating such a photocoupler.

The present invention provides a photocoupler comprising:

a pair of lead frames;

a light-emitting device placed on one of the pair of lead frames;

a light-receiving device placed on the other lead frame for receiving light emitted from the light-emitting device;

a primary mold body made of a light transparent resin for covering the light-emitting device and the light-receiving device; and a secondary mold body made of a light-shading resin for covering the primary mold body, wherein the pair of lead frames are bent in the secondary mold body, and outer side faces of terminal portions ranging from the bent positions to top ends of the lead frames are exposed at surfaces of the secondary mold body.

According to the invention, the pair of lead frames are bent in the secondary mold body. The outer side face of the terminal portion of each of the lead frames, ranging from the bent position to the top end thereof, is exposed at the surface of the secondary mold body. That is, the outer side faces of the terminal portions are not covered with the secondary mold body, and thus the mold amount of the secondary mold body can be minimized. As a result, the mount area required to mount the photocoupler on an object can be reduced.

In the invention it is preferable that the secondary mold body has a concave portion, and a top end of the terminal portion protrudes from the concave portion.

For example, the concave portion is formed at a position corresponding to the top end of the terminal portion, so that the top end of the terminal portion protrudes from the concave portion. Therefore, soldering of the secondary mold body to an object for mounting can be made in the concave portion. This eliminates the necessity of securing a space for soldering near the secondary mold body, and thus the mount area required to mount the photocoupler on the object can be reduced.

In the invention it is preferable that a thermoplastic resin is used as the light-shading resin.

The present invention provides a photocoupler fabrication apparatus for fabricating the photocoupler described above, comprising:

a pair of fixing molds for fixedly sandwiching the primary mold body therebetween vertically;

a pair of lead frame pinch molds placed on both sides of the fixing molds for pinching base ends of the pair of lead frames; and a bending mold placed on outer sides of the lead frame pinch molds for bending the pair of lead frames fixedly pinched by the lead frame pinch molds, wherein the pair of fixing molds, the pair of lead frame pinch molds and the bending mold define a mold space for the secondary mold body.

According to the invention described above, with the construction of the pair of fixing molds, the pair of lead frame pinch molds and the bending mold, the secondary mold body can be molded into a desired shape, while the mold amount can be minimized. As a result, it is possible to fabricate a photocoupler in which the mount area of the body case constructed of the primary mold body and the secondary mold body can be reduced according to the shape of an object on which the photocoupler is to be mounted.

In the invention, it is preferable that correction means for correcting a position of the primary mold body with the bent lead frames in the mold space is provided.

According to the invention, with the correction means, when the primary mold body with the bent lead frames is not in a desired position, the primary mold body can be moved to the desired position. Therefore, it is possible to form the secondary mold body in which the primary mold body is in a desired position without fail.

The lead frame pinch mold may be allowed to protrude in the mold space during the molding of the second mold body.

According to the invention, since the lead frame pinch mold is allowed to protrude in the mold space during the molding of the second mold body, a concave portion can be formed on the second molded body. This makes it possible to secure a space for soldering of the top end of the lead frame to an object on which the photocoupler is mounted, mold the secondary mold body into a shape according to the shape of the object, and/or prevent misidentification of the position of a component embedded in the body case.

In the invention, it is preferable that concave grooves for allowing the pair of bent lead frames to fit therein are formed on the lead frame pinch molds, and the lead frame pinch molds is permitted to protrude in the mold space in molding the secondary mold body so that top ends of the pair of lead frames fit in the concave grooves.

According to the invention, the lead frame pinch molds protrude in the mold space during the molding of the secondary mold body so that the top ends of the pair of bent lead frames extending from the primary mold body fit in the concave grooves formed on the lead frame pinch molds. Therefore, concave portions can be formed on the resultant secondary mold body, and the top ends of the pair of lead frames are allowed to protrude from the concave portions.

In the invention, it is preferable that cutting means for cutting away unnecessary portions of the pair of lead frames is placed on the outer sides of the bending mold.

According to the invention, since the cutting means for cutting away unnecessary portions of the pair of lead frames is provided, the length of the lead frames can be changed according to a desired shape of the secondary mold body.

The present invention provides a method for fabricating the photocoupler described above, comprising the steps of: fixing the primary mold body by vertically sandwiching the primary mold body between the pair of lead frames; bending the pair of lead frames in a predetermined direction while pinching base portions of the lead frames; releasing the primary mold body from the vertically sandwiched fixed state to form a mold space; and injecting a light-shading resin into the mold space, to form the secondary mold body.

According to the invention, a-photocoupler is fabricated by fixing the primary mold body by vertically sandwiching between the pair of lead frames, bending the pair of lead frames in a predetermined direction while the base portions of the lead frames are pinched, and forming the secondary mold body by injection of a resin. Therefore, the secondary mold body can be formed with the minimum resin amount. As a result, it is possible to fabricate a photocoupler which can be mounted on an object without necessitating large mount area therefor.

In the invention, it is preferable that, prior to the injection of the light-shading resin into the mold space, a position of the primary mold body with the bent lead frames in the mold space is corrected.

According to the invention; the position of the primary mold body with the bent lead frames in the mold space is corrected prior to the injection of the light-shading resin into the mold space. Therefore, it is possible to form the secondary mold body with the primary mold body placed in a proper position in the mold space.

In the invention, it is preferable that, prior to the injection of the light-shading resin into the mold space, part of faces defining the mold space is made to protrude in the mold space.

According to the invention, part of the faces defining the mold space is made to protrude in the mold space prior to the injection of the light-shading resin into the mold space. Therefore, the volume of the mold space into which the light-shading resin is injected can be reduced. In addition, a concave portion can be formed on the resultant secondary mold body, and the top end of the bent lead frame maybe made to protrude from the concave portion.

In the invention, it is preferable that, prior to the bending of the lead frames, unnecessary portions of the lead frames are cut away.

According to the invention, since unnecessary portions of the lead frames are cut away prior to the bending of the lead frames, it is possible to cut away unnecessary portions of the lead frames that may otherwise protrude from the resultant secondary mold body before the formation of the secondary mold body. Therefore, a photocoupler can be easily fabricated with good precision without occurrence of protrusion of unnecessary portions of the lead frames from the resultant secondary mold body.

According to the present invention, it is possible to provide a photocoupler capable of reducing the mount area required to mount the photocoupler on an object by eliminating a structurally unnecessary portion, and a method and apparatus for fabricating such a photocoupler.

With the recent improvement in substrate wiring technology, objects on which photocouplers are mounted have attained high performance and downsizing, and devices have been mounted on the objects with higher mount rate. In these circumstances, according to the present invention, it is possible to reduce the mount area required to mount the photocoupler on an object.

To state in more detail, a photocoupler must be fabricated in consideration of the following points: double transfer molding for forming the primary mold body and the secondary mold body, the positional relationship of the lead frames supporting the light-receiving device and the light-emitting device inside the photocoupler, securing of a space for placing the top ends of the lead frames to be soldered to an object on which the photocoupler is mounted, and the like. By use to the photocoupler fabrication apparatus and method according to the present invention, it is possible to fabricate a photocoupler which can be mounted on an object without necessitating large mount area, in addition to satisfying the above fabrication requirements.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
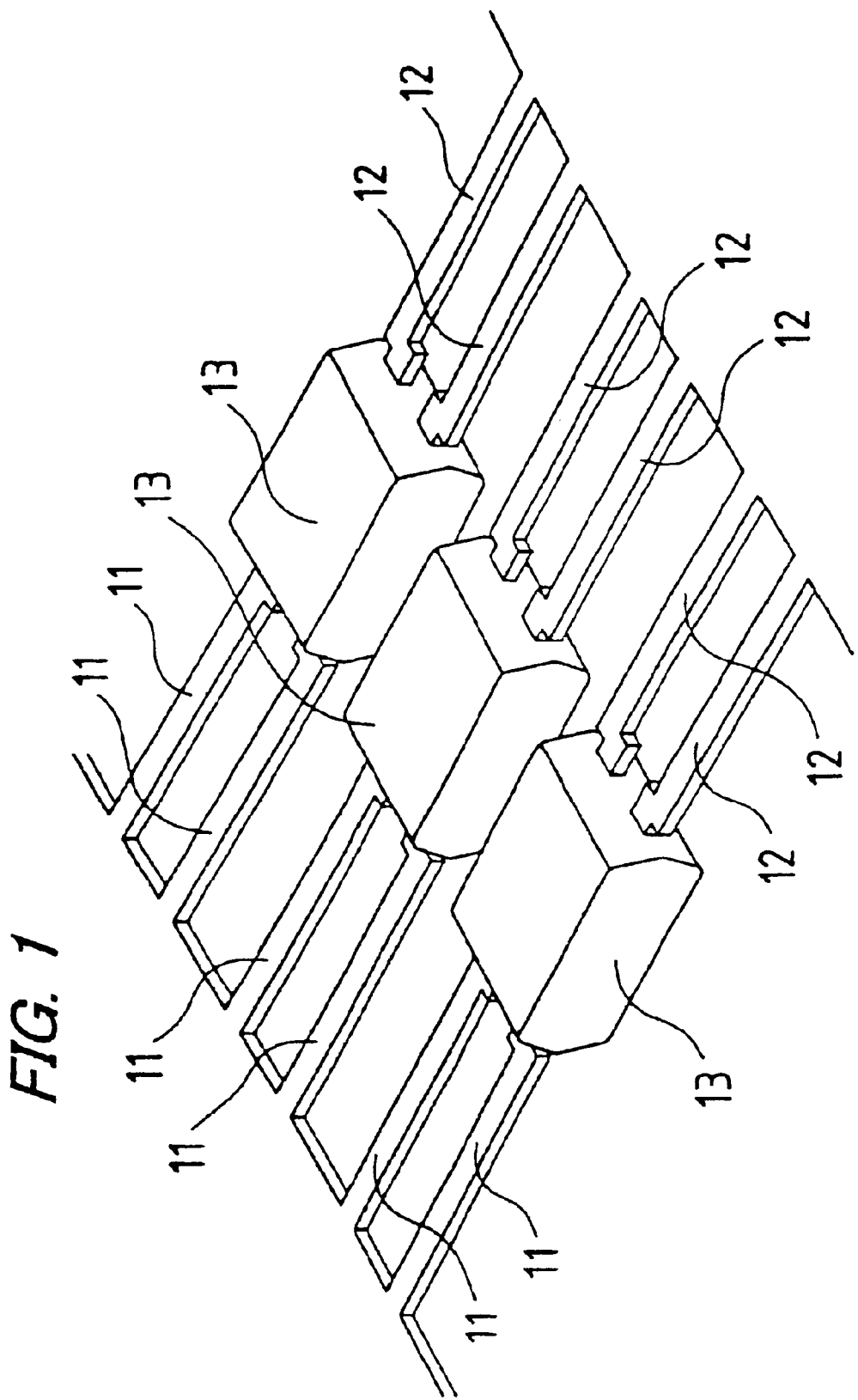
FIG. 1 is a perspective view of a plurality of primary mold bodies each having a pair of protruding lead frames in the first embodiment of the present invention.

Now referring to the drawings, preferred embodiments of the invention are described below.

<First Embodiment>

Figure 2:
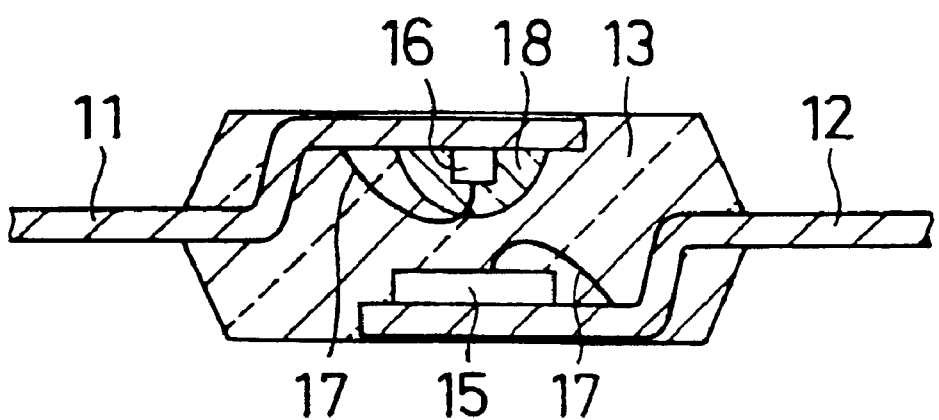
FIG. 2 is a simplified cross-sectional view of one of the primary mold bodies.

The photocoupler of the first embodiment of the invention is shown in FIGS. 1 and 2. FIG. 1 is a perspective view showing a plurality of primary mold bodies each having a pair of protruding lead frames. FIG. 2 is a simplified cross-sectional view of one of the primary mold bodies. The plurality of primary mold bodies with protruding lead frames are the same in structure. Therefore, the following detailed description of the photocoupler and the fabrication process thereof will be made for one primary mold body taken from the plurality of primary mold bodies.

Referring to FIG. 2, a pair of lead frames 11 and 12 protrude from a primary mold body 13. The lead frames 11 and 12 support a light-receiving device 15 and a light-emitting device 16, respectively.

The light-receiving device 15 and the light-emitting device 16 are placed to face each other on the same optical axis, and attached to the lead frames 11 and 12, respectively, with bonding wires 17 such as gold wires. The light-emitting device is pre-coated with a transparent silicone resin 18 for relieving stress at a junction and the like.

Transfer molding is then performed for the light-receiving device 15 and the light-emitting device 16 placed on the same optical axis, using a transparent resin. By the transfer molding, the light-receiving device 15 and the light-emitting device 16 are embedded in the transparent resin to form a primary mold body 13.

The primary mold body 13 is then shaped by burring and tie bar cut. The lead frames 11 and 12 protrude from the sides of the primary mold body 13. In this way, the primary mold bodies 13 each having the pair of protruding lead frames 11 and 12 shown in FIG. 1 are fabricated.

Figure 3:
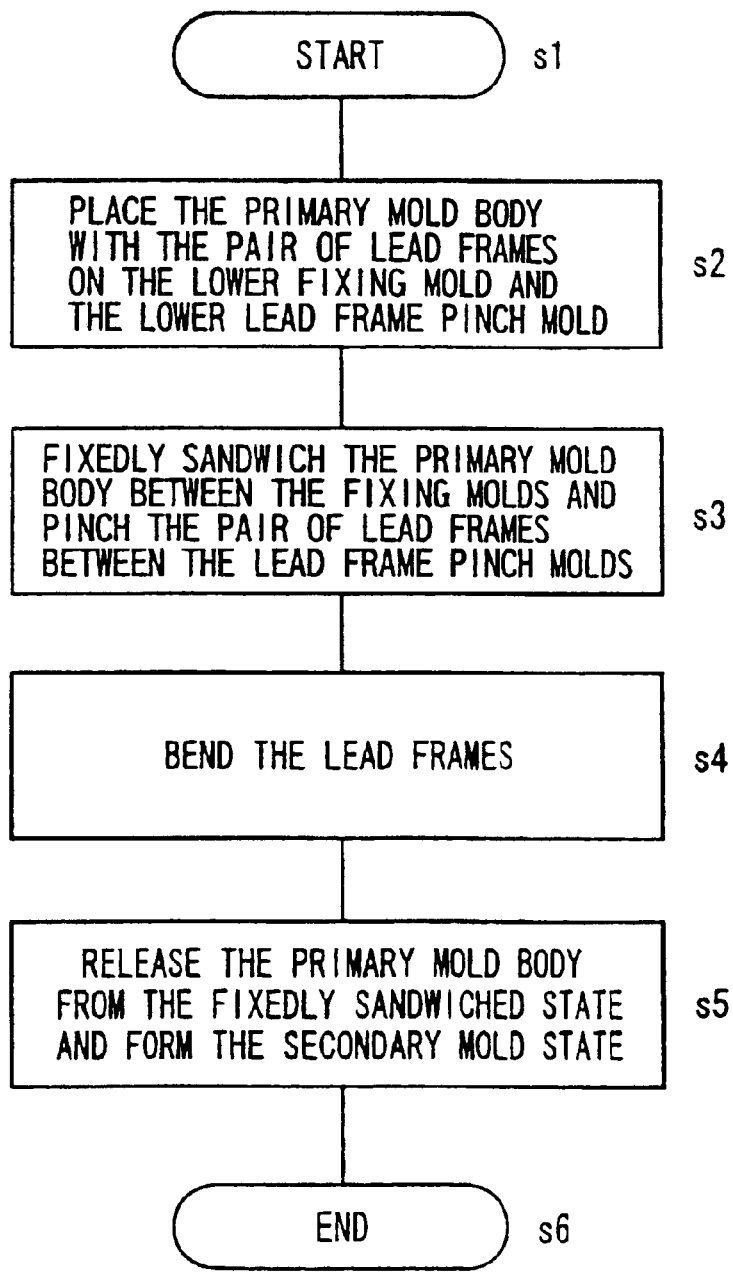
FIG. 3 is a flowchart of a fabrication process of a photocoupler of the first embodiment of the invention.

The primary mold body 13 with the pair of protruding lead frames 11 and 12 is then placed in a photocoupler fabrication apparatus (hereinafter, simply called an apparatus) 2 shown in FIGS. 4, 5, 6 and 7. FIG. 3 is a flowchart showing a fabrication process of the photocoupler of the first embodiment of the invention. FIGS. 4, 5, 6 and 7 are cross-sectional views of the apparatus 2, showing sequential process steps 1 to 4 of the fabrication process of the photocoupler of this embodiment.

The apparatus 2 includes a fixing mold 21 for fixing the primary mold body 13, a lead frame pinch mold 22 for pinching the pair of lead frames 11 and 12, and a bending mold 23 for bending the lead frames 11 and 12.

The fixing mold 21 is composed of an upper fixing mold 211 and a lower fixing mold 212 placed to face each other vertically. Both the upper and lower fixing molds 211 and 212 are vertically movable. The upper fixing mold 211 has a resin injection gate (not shown) for injection of a resin into a mold space A (see FIG. 7) formed inside the apparatus 2 by vertical movement of the components of the fixing mold 21.

The lead frame pinch mold 22, which is constructed of two parts, is composed of an upper lead frame pinch mold 221 and a lower lead frame pinch mold 222, and is placed on both sides of the fixing mold 21. Both the upper and lower lead frame pinch molds 221 and 222 are vertically movable. The cross-section of the upper lead frame pinch mold 221 is greater than the cross section of the lower lead frame pinch mold 222 by the cross section of the end of the lead frame 11 or 12. In other words, the size of the face of the upper lead frame pinch mold 221 in contact with the lead frame 11 or 12 is set greater than the size of the face of the lower lead frame pinch mold 222 in contact with the lead frame 11 or 12 by the cross section of the end of the lead frame 11 or 12.

The bending mold 23 is constructed of two parts, and placed on the outer sides of the lead frame pinch mold 22.

Hereinafter, the fabrication process of the photocoupler with the apparatus 2 will be described.

In step S1 in FIG. 3, fabrication of the photocoupler is started. In step S2 as process step 1 shown in FIG. 4, the primary mold body 13 with the pair of protruding lead frames 11 and 12 is placed on the lower fixing mold 212 and the lower lead frame pinch mold 222.

Figure 5:
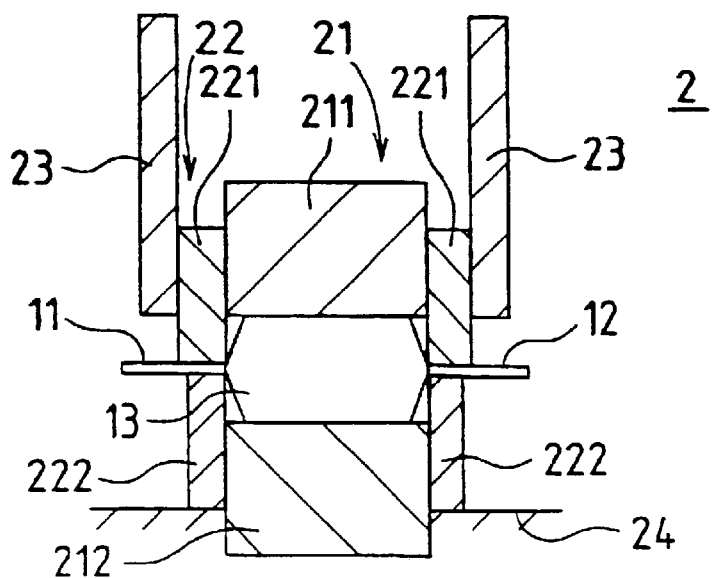
FIG. 5 is a cross-sectional view of the fabrication apparatus, showing process step 2 of the fabrication process of the photocoupler of the first embodiment of the invention.

In step S3 as process step 2 shown in FIG. 5, once the primary mold body 13 is placed, the upper fixing mold 211 is lowered, to fixedly sandwich the primary mold body 13 between the upper and lower fixing molds 211 and 212. The upper lead frame pinch mold 221 is also lowered, to fixedly pinch the base ends of the lead frames 11 and 12 between the upper and lower lead frame pinch molds 221 and 222.

Figure 6:
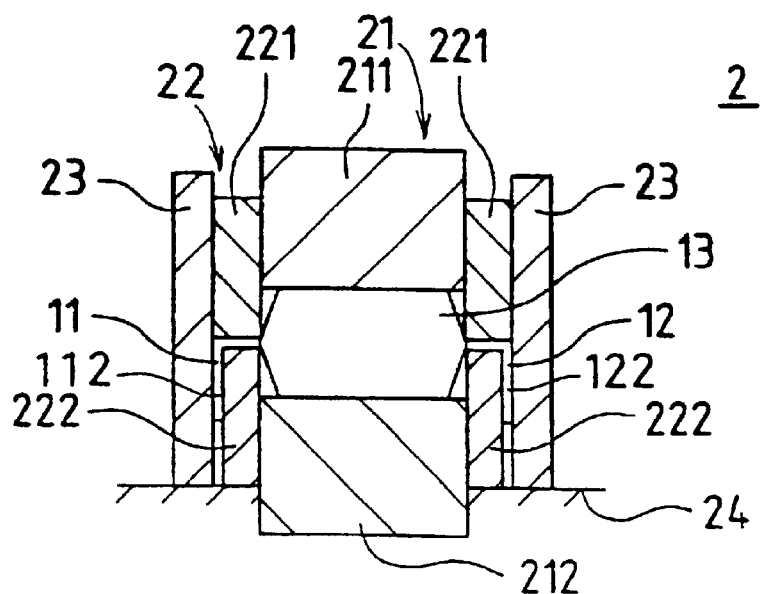
FIG. 6 is a cross-sectional view of the fabrication apparatus, showing process step 3 of the fabrication process of the photocoupler of the first embodiment of the invention.

In step S4 as process step 3 shown in FIG. 6, after the fixing of the primary mold body 13 by the fixing mold 21 and the pinching of the lead frames 11 and 12 by the lead frame pinch mold 22, the bending mold 23 is lowered. By this lowering of the bending mold 23, the lead frames 11 and 12 pinched by the lead frame pinch mold 22 are bent along the outer sides of the two parts of the lower lead frame pinch mold 222. Hereinafter, the portions of the lead frames 11 and 12 ranging from the bent positions to the top ends are called terminal portions 112 and 122, respectively.

Figure 7:
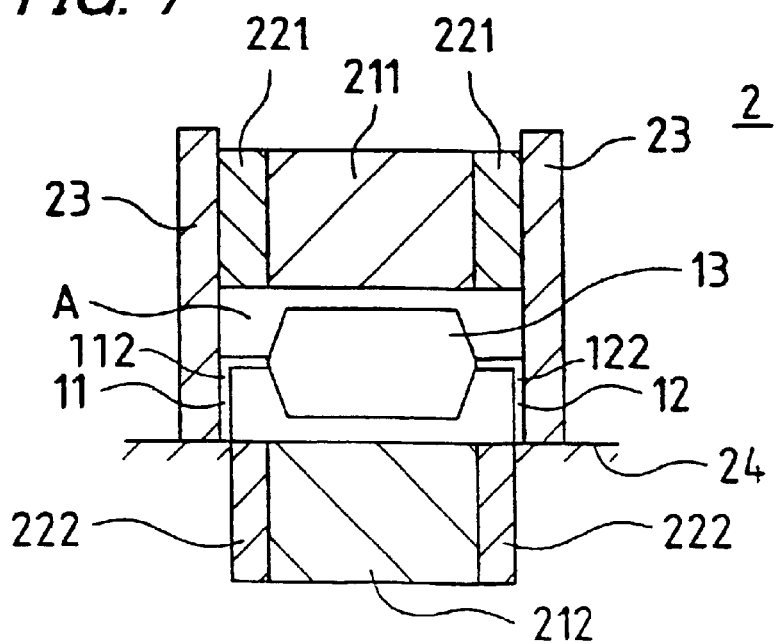
FIG. 7 is a cross-sectional view of the fabrication apparatus, showing process step 4 of the fabrication process of the photocoupler of the first embodiment of the invention.

In step S5 as process step 4 shown in FIG. 7, after the bending of the lead frames 11 and 12, the lower fixing mold 212 and the lower lead frame pinch mold 222 are lowered, so that the surface of the lower fixing mold 212 in contact with the primary mold body 13 and the faces of the lower lead frame pinch mold 222 in contact with the lead frames 11 and 12 are flush with a reference plane 24. By this lowering, the primary mold body 13 with the pair of protruding lead frames 11 and 12 is released from the vertically sandwiched fixed state, and the mold space A is formed inside the apparatus 2. The primary mold body 13 drops until the top ends of the protruding lead frames 11 and 12 reach the reference plane 24. The position of the reference plane 24 is set to be in line with the bottom of the mold space A.

Figure 8A:
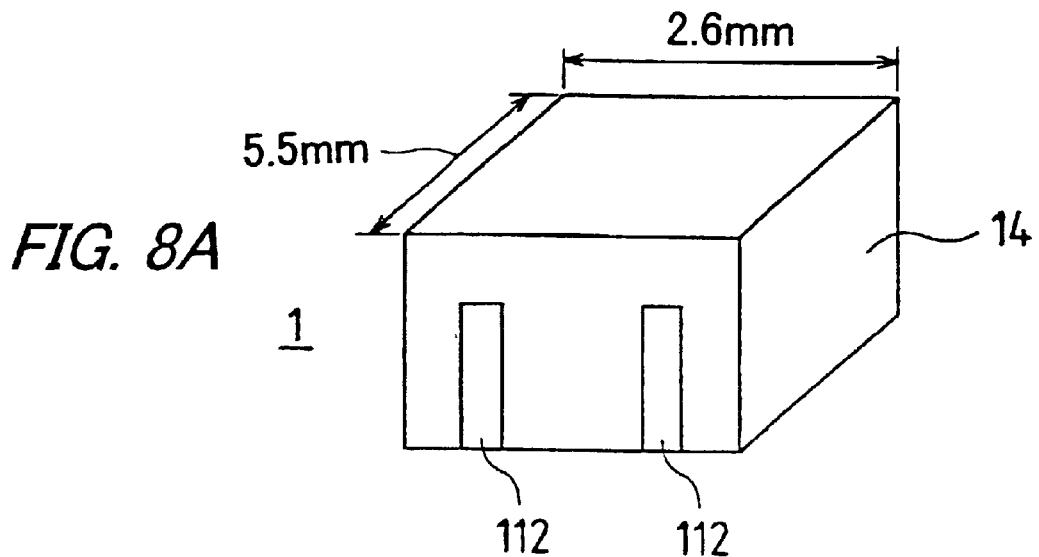
FIG. 8A is a schematic perspective view of a photocoupler of the invention, as is viewed from above
Figure 8B:
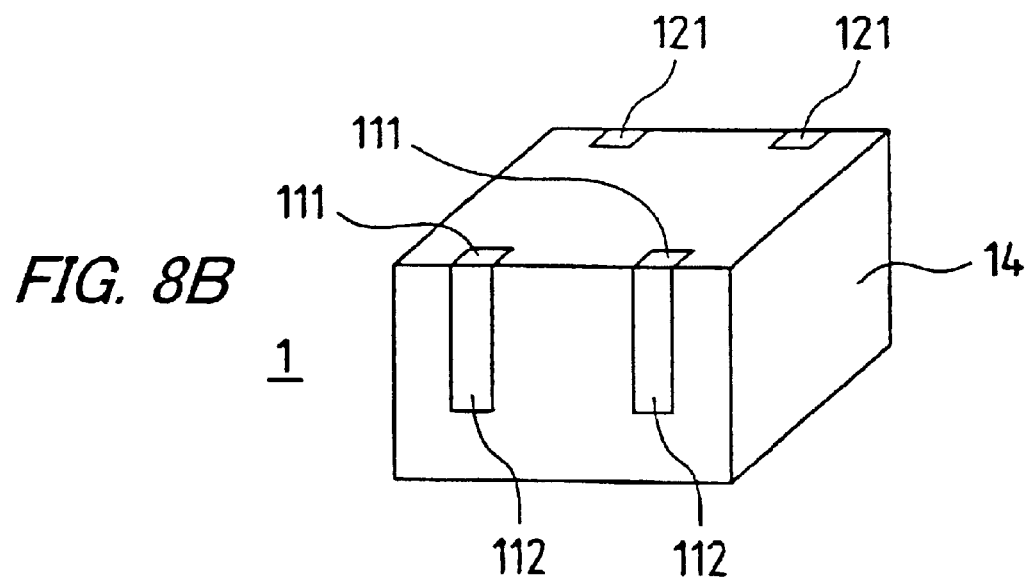
FIG. 8B is a schematic perspective view of the photocoupler of the invention, as is viewed from below.

Once the top ends of the lead frames 11 and 12 reach the reference plane 24, a light-shading resin is injected into the mold space A from the resin injection gate of the upper fixing mold 211. With the injection of the light-shading resin, a secondary mold body 14 is formed in the mold space A. Thus, a photocoupler 1 as shown in FIGS. 8A and 8B is fabricated. The series of fabrication process steps is terminated in step S6.

FIGS. 8A and 8B are schematic perspective views of the photocoupler 1 of the first embodiment, as is viewed from above and below, respectively.

In the first embodiment, a light-shading resin is used for the secondary mold body 14. Alternatively, a thermoplastic resin such as polyphenylene sulfide (PPS) may be used. In the apparatus 2 having many constituting parts and working parts, there is a concern for a breakdown due to frequent occurrence of resin leakage. By use of a thermoplastic resin having high viscosity during injection of the resin, occurrence of a breakdown due to resin leakage will be prevented.

Thus, in the photocoupler 1 fabricated by the fabrication process of process steps 1 to 4 described above, not only the top ends 111 and 121, but also the terminal portions 112 and 122 of the lead frames 11 and 12 are exposed at the surfaces of the secondary mold body 14. That is, the terminal portions 112 and 122 of the lead frames 11 and 12 are not covered with the secondary mold body 14, and thus the molding amount of the secondary mold body 14 can be minimized. As a result, the mount area required to mount the photocoupler 1 on an object can be reduced.

The apparatus 2 is also provided with correcting means for correcting the position of the primary mold body 13 with the pair of protruding lead frames 11 and 12.

The function of the correcting means is realized by moving the primary mold body 13 with the pair of protruding lead frames 11 and 12 using the fixing mold 21.

Figure 9:
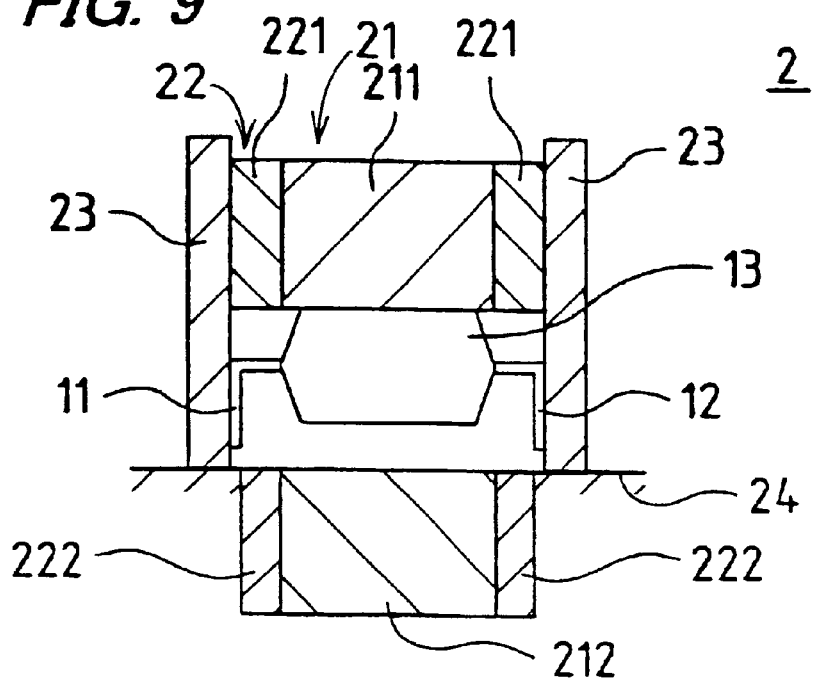
FIG. 9 is a cross-sectional view of the photocoupler fabrication apparatus in a position before execution of correcting means in the first embodiment of the invention.

Hereinafter, the correcting means will be described in detail with reference to FIGS. 6, 7, 9 and 10. FIG. 9 is a cross-sectional view of the apparatus 2 in a position before execution of the correcting means, while FIG. 10 is a cross-sectional view of the apparatus 2 in a position during execution of the correcting means.

Once the lead frames 11 and 12 are bent as shown in FIG. 6, the lower fixing mold 212 and the lower lead frame pinch mold 222 are lowered, so that the surface of the lower fixing mold 212 in contact with the primary mold body 13 and the faces of the lower lead frame pinch mold 222 in contact with the lead frames 11 and 12 are flush with the reference plane 24 as shown in FIG. 7. By this lowering, the mold space A is formed inside the apparatus 2.

In the case that the friction force generated at the contact interface between the bent lead frames 11 and 12 and the parts of the bending mold 23 increases due to elastic recovery force and the like, the lead frames 11 and 12 protruding from the primary mold body 13 fail to drop until the top ends thereof reach the reference plane 24 as shown in FIG. 9, unlike the position shown in FIG. 7.

Figure 10:
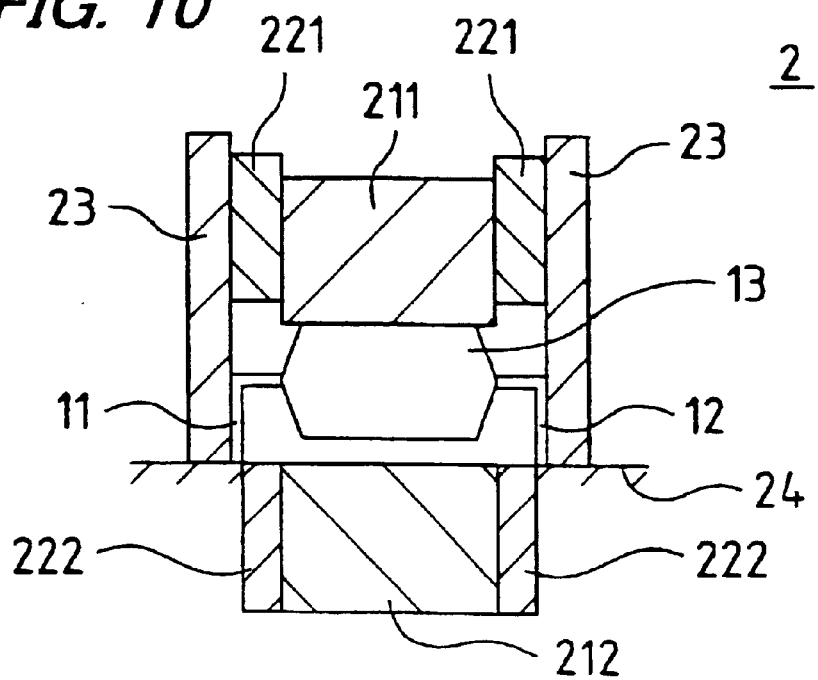
FIG. 10 is a cross-sectional view of the photocoupler fabrication apparatus in a position during execution of the correcting means in the first embodiment of the invention.

In the event described above, the upper fixing mold 211 is lowered to a position lower than the upper lead frame pinch mold 221 as shown in FIG. 10. The lowered upper fixing mold 211 presses the primary mold body 13 downward so that the top ends of the lead frames 11 and 12 protruding from the primary mold body 13 reach the reference plane 24. When the top ends of the lead frames 11 and 12 have reached the reference plane 24, the upper fixing mold 211 is lifted to the original position as shown in FIG. 7.

Thus, by providing the correction means for the apparatus 2, it is possible to lower the lead frames 11 and 12 protruding from the primary mold body 13 until the top ends thereof reach the reference plane 24 even when they have failed to reach the reference plane 24.

The apparatus 2 described above, having the vertically-movable lead frame pinch mold 22, can also fabricate photocouplers different in shape from the photocoupler 1.

Figure 11:
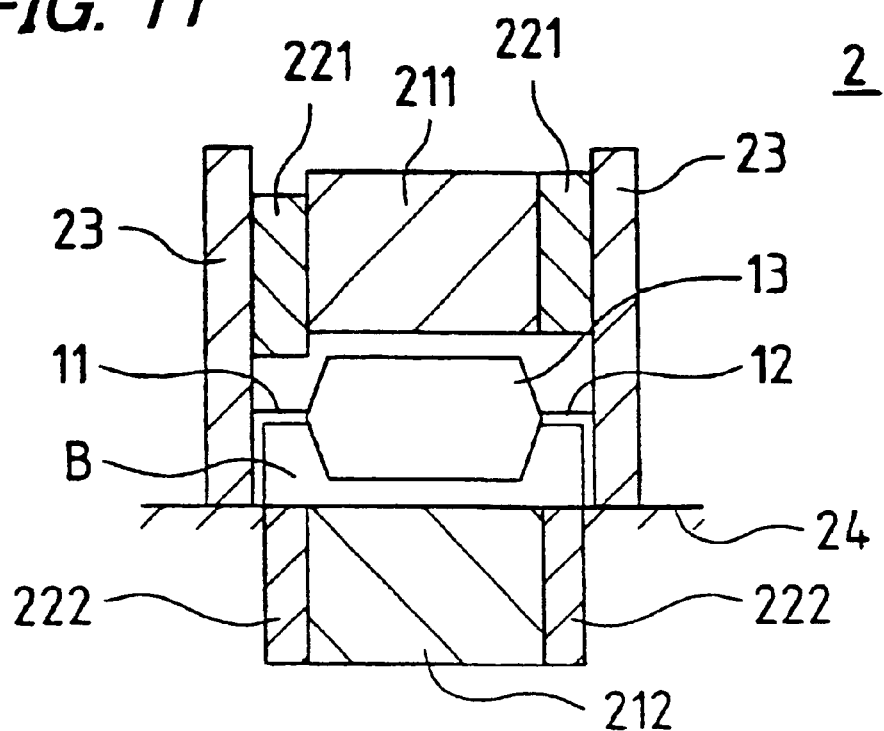
FIG. 11 is a cross-sectional view of the photocoupler fabrication apparatus of the first embodiment of the invention.

Hereinafter, an example of such photocouplers and the fabrication process thereof will be described with reference to FIGS. 4, 5, 6, 7 and 11. FIG. 11 is a cross-sectional view of the photocoupler fabrication apparatus 2.

Figure 4:
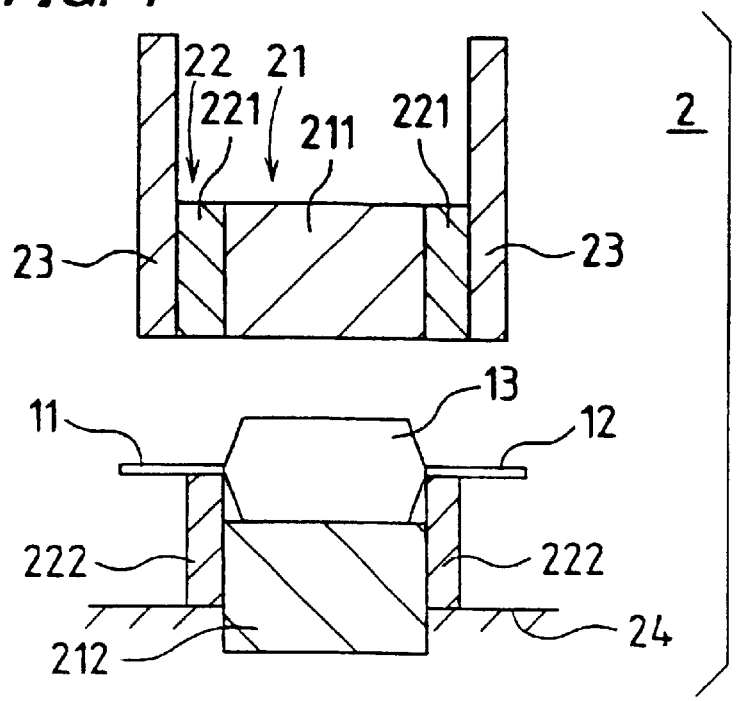
FIG. 4 is a cross-sectional view of a fabrication apparatus, showing process step 1 of the fabrication process of the photocoupler of the first embodiment of the invention.

As shown in FIG. 4, the primary mold body 13 with the pair of the protruding lead frames 11 and 12 is placed on the lower fixing mold 212 and the lower lead frame pinch mold 222.

Once the primary mold body 13 is placed, as shown in FIG. 5, the upper fixing mold 211 is lowered, to fixedly sandwich the primary mold body 13 between the upper and lower fixing molds 211 and 212. The upper lead frame pinch mold 221 is also lowered, to fixedly pinch the base ends of the lead frames 11 and 12 between the upper and lower lead frame pinch molds 221 and 222.

After the fixing of the primary mold body 13 by the fixing mold 21 and the pinching of the lead frames 11 and 12 by the lead frame pinch mold 22, the bending mold 23 is lowered. By this lowering of the bending mold 23, as shown in FIG. 6, the lead frames 11 and 12 pinched by the lead frame pinch mold 22 are bent along the outer sides of the two parts of the lower lead frame pinch mold 222.

After the bending of the lead frames 11 and 12, the lower fixing mold 212 and the lower lead frame pinch mold 222 are lowered as shown in FIG. 7. By this lowering, the primary mold body 13 with the pair of protruding lead frames 11 and 12 is released from the vertically sandwiched fixed state, and the mold space A is formed inside the apparatus 2. The primary mold body 13 drops until the top ends of the protruding lead frames 11 and 12 reach the reference plane 24.

After the top ends of the lead frames 11 and 12 protruding from the primary mold body 13 reach the reference plane 24, one of the two parts of the upper lead frame pinch mold 221 is lowered to protrude downward, to thereby form a mold space B having an uneven top surface inside the apparatus 2 as shown in FIG. 11. In other words, part of the faces defining the mold space B protrude into the mold space B.

Figure 12:
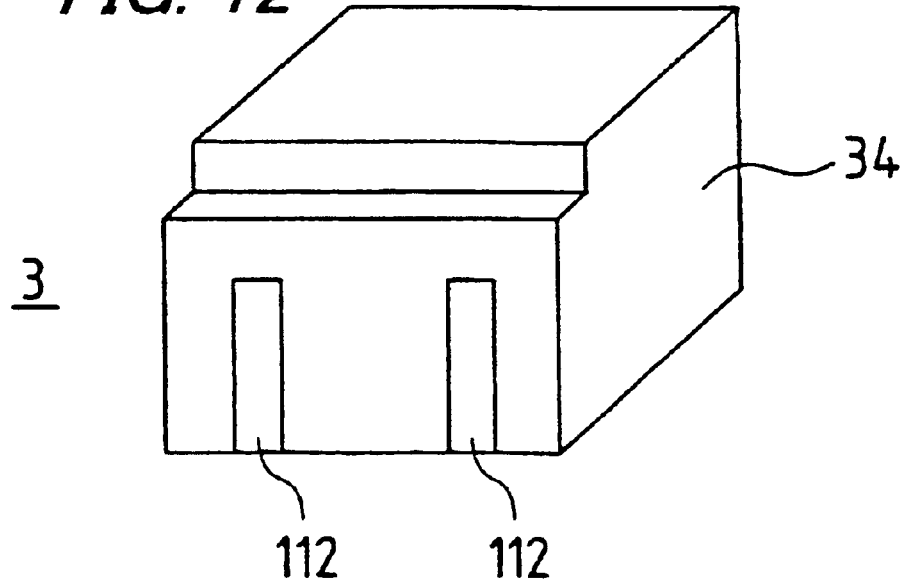
FIG. 12 is a schematic perspective view of a photocoupler having an uneven top surface of the first embodiment of the invention, as is viewed from above.

After the formation of the mold space B, a light-shading resin is injected into the mold space B from the resin injection gate of the upper fixing mold 211. With the injection of the light-shading resin, a secondary mold body 14 is formed in the mold space B. Thus, a photocoupler 3 as shown in FIG. 12 is fabricated. FIG. 12 is a schematic perspective view of the photocoupler 3 having an uneven top surface, as is viewed from above.

As described above, by forming a concave portion along one side of the top surface of the photocoupler 3, it is possible to distinguish the sides of the lead frames 11 and 12 supporting the light-receiving device 15 and the light-emitting device 16 from each other.

<Second Embodiment>

The second embodiment of the invention is the same as the first embodiment described above except for the lower lead frame pinch mold 222 of the apparatus 2. Therefore, the same components as those in the first embodiment are denoted by the same reference numerals, and the description thereof is omitted here.

Figure 13:
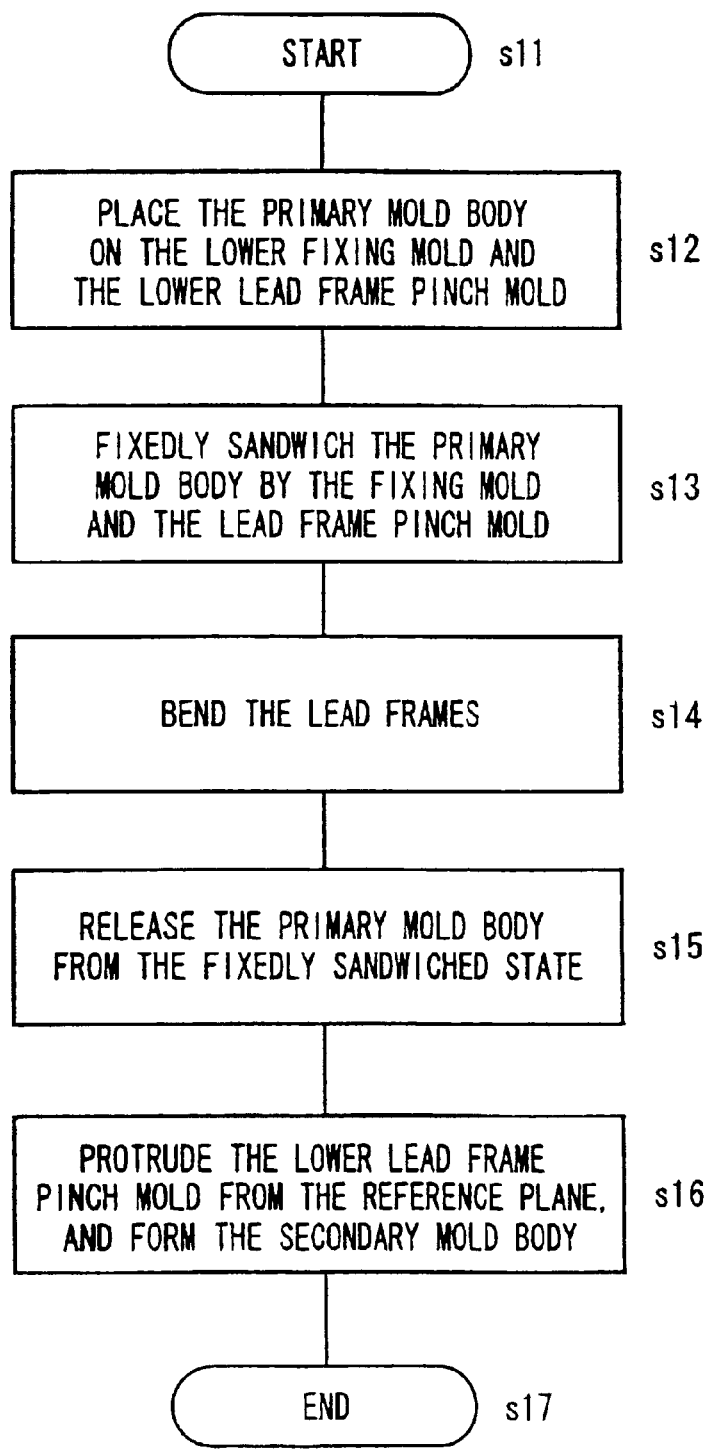
FIG. 13 is a flowchart of a fabrication process of a photocoupler of the second embodiment of the invention.
Figure 14:
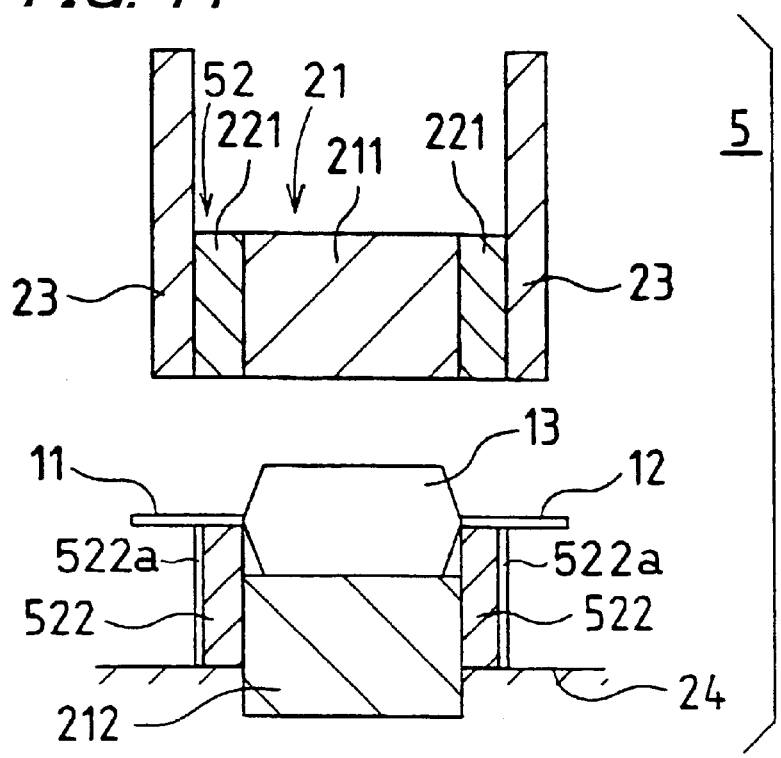
FIG. 14 is a cross-sectional view of a fabrication apparatus, showing process step 1 of the fabrication process of the photocoupler of the second embodiment of the invention.

The primary mold body 13 with the pair of protruding lead frames 11 and 12 is placed in an apparatus 5 shown in FIGS. 14, 15, 16, 17 and 18. FIG. 13 is a flowchart of a fabrication process of the photocoupler of the second embodiment of the invention. FIGS. 14, 15, 16, 17 and 18 are cross-sectional views of the apparatus 5, showing sequential process steps 1 to 5 of the fabrication process of the photocoupler of this embodiment.

The apparatus 5 includes a fixing mold 21 for fixing the primary mold body 13, a lead frame pinch mold 52 for pinching the lead frames 11 and 12, and a bending mold 23 for bending the lead frames 11 and 12.

The lead frame pinch mold 52, which is constructed of two parts, is composed of an upper lead frame pinch mold 221 and a lower lead frame pinch mold 522, and is placed on both sides of the fixing mold 21. Both the upper and lower lead frame pinch molds 221 and 522 are vertically movable. Each part of the lower lead frame pinch mold 522 has a concave groove 522a on the side of the bending mold 23 for insertion of the lead frame. The size of the concave grooves 522a is roughly the same as the cross section of the lead frames 11 and 12. The size of the face of the lower lead frame pinch mold 522 in contact with the lead frame 11 or 12 is roughly the same as the size of face of the upper lead frame pinch mold 221 in contact with the lead frame 11 or 12. However, in the portion of the lower lead frame pinch mold 522 in which the concave groove 522a is formed, the size of the former is smaller than that of the latter by the depth of the concave groove 522a.

Hereinafter, the fabrication process of the photocoupler with the apparatus 5 will be described in detail.

In step S11 in FIG. 13, fabrication of the photocoupler is started. In step S12 as process step 1 shown in FIG. 14, the primary mold body 13 with the pair of protruding lead frames 11 and 12 is placed on the lower fixing mold 212 and the lower lead frame pinch mold 522.

Figure 15:
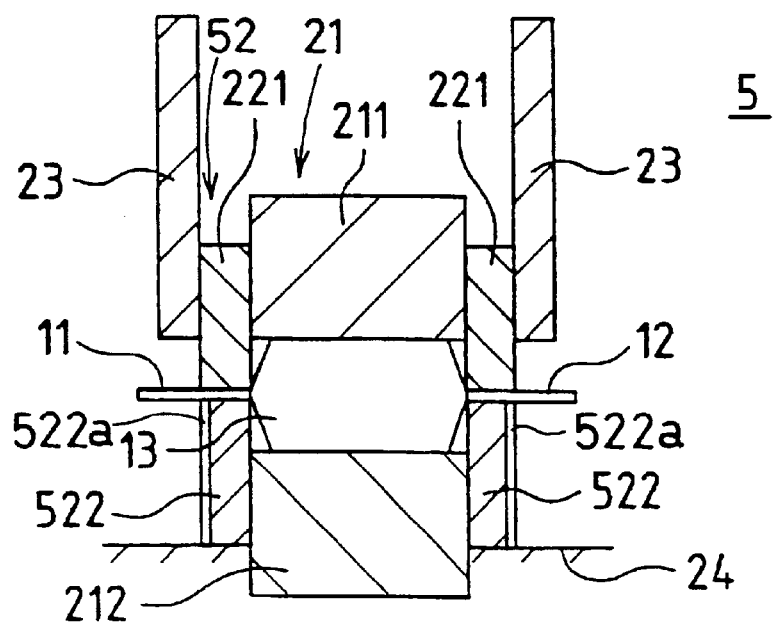
FIG. 15 is a cross-sectional view of a fabrication apparatus, showing process step 2 of the fabrication process of the photocoupler of the second embodiment of the invention.

In step S13 as process step 2 shown in FIG. 15, once the primary mold body 13 is placed, the upper fixing mold 211 is lowered, to fixedly sandwich the primary mold body 13 between the upper and lower fixing molds 211 and 212. The upper lead frame pinch mold 221 is also lowered, to fixedly pinch the base ends of the lead frames 11 and 12 between the upper and lower lead frame pinch molds 221 and 522.

Figure 16:
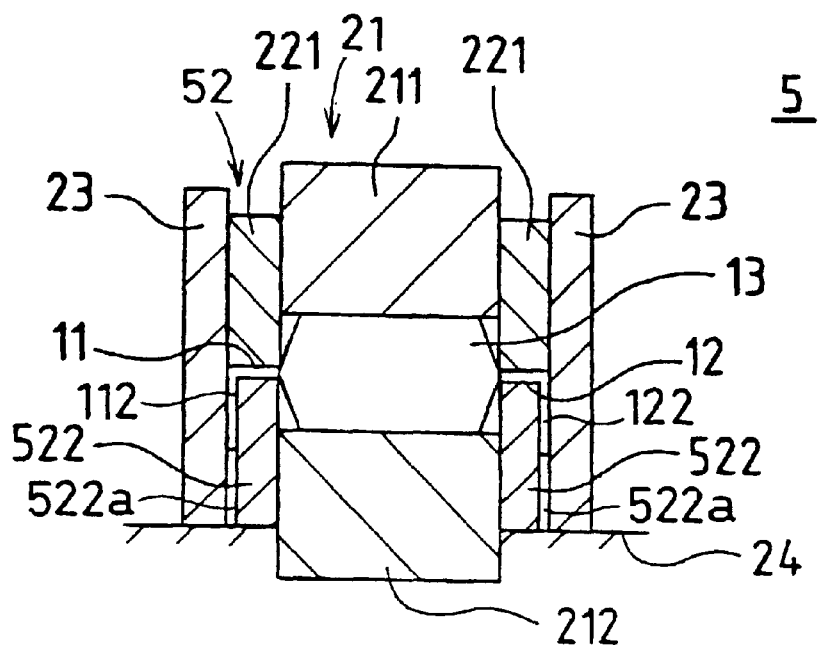
FIG. 16 is a cross-sectional view of a fabrication apparatus, showing process step 3 of the fabrication process of the photocoupler of the second embodiment of the invention.

In step S14 as process step 3 shown in FIG. 16, after the fixing of the primary mold body 13 by the fixing mold 21 and the pinching of the lead frames 11 and 12 by the lead frame pinch mold 52, the bending mold 23 is lowered. By this lowering of the bending mold 23 as shown in FIG. 16, the lead frames 11 and 12 pinched by the lead frame pinch mold 52 are inserted into and fit in the concave grooves 522a of the two parts of the lower lead frame pinch mold 522, and bent along the sides of the parts of the lower lead frame pinch mold 52 defining the bottom of the concave grooves 522a.

Figure 17:
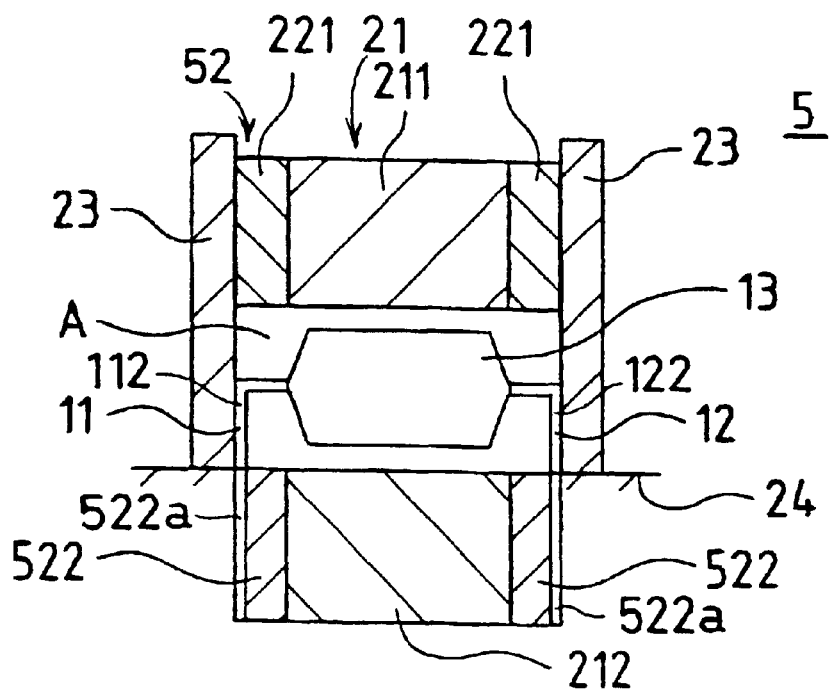
FIG. 17 is a cross-sectional view of a fabrication apparatus, showing process step 4 of the fabrication process of the photocoupler of the second embodiment of the invention.

In step S15 as process step 4 shown in FIG. 17, after the bending of the lead frames 11 and 12, the lower fixing mold 212 and the lower lead frame pinch mold 522 are lowered, so that the surface of the lower fixing mold 212 in contact with the primary mold body 13 and the faces of the lower lead frame pinch mold 522 in contact with the lead frames 11 and 12 are flush with a reference plane 24. By this lowering, the primary mold body 13 with the pair of protruding lead frames 11 and 12 is released from the vertically sandwiched fixed state, and the mold space A is formed inside the apparatus 5. The top ends of the lead frames 11 and 12 protruding from the released primary mold body 13 drops until they reach the reference plane 24.

Figure 18:
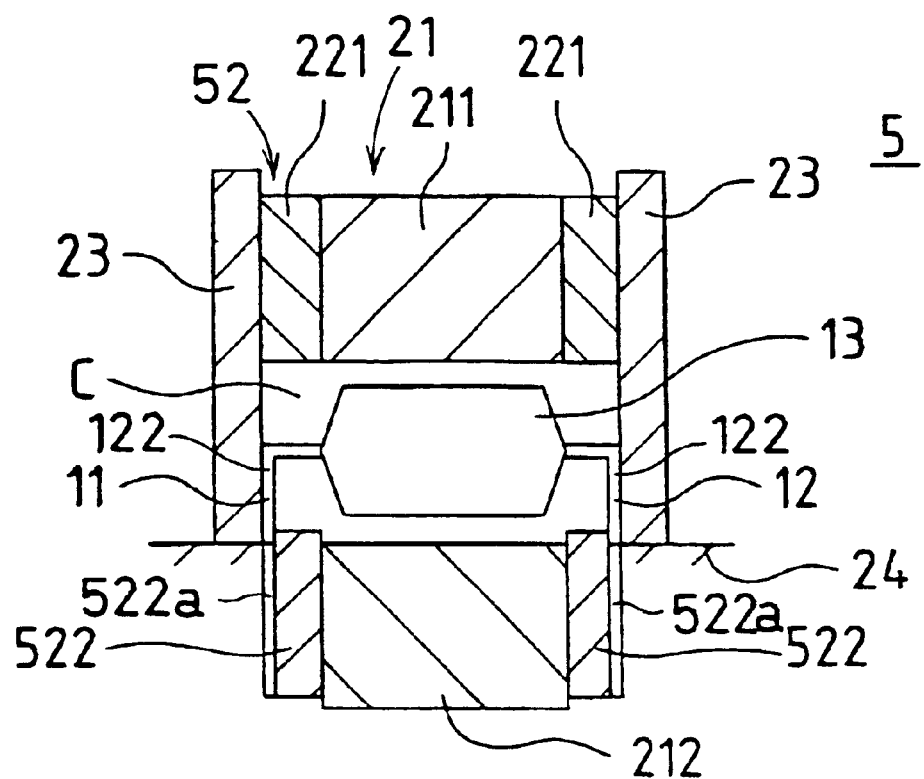
FIG. 18 is a cross-sectional view of a fabrication apparatus, showing process step 5 of the fabrication process of the photocoupler of the second embodiment of the invention.

In step S16 as process step 5 shown in FIG. 18, once the top ends of the lead frames 11 and 12 reach the reference plane 24, the lower lead frame pinch mold 522 constructed of two parts is lifted to protrude upward from the reference plane 24 by a predetermined amount, to form a mold space C having an uneven bottom surface in the apparatus 5. In other words, part of the faces defining the mold space C protrude into the mold space C.

Figure 19A:
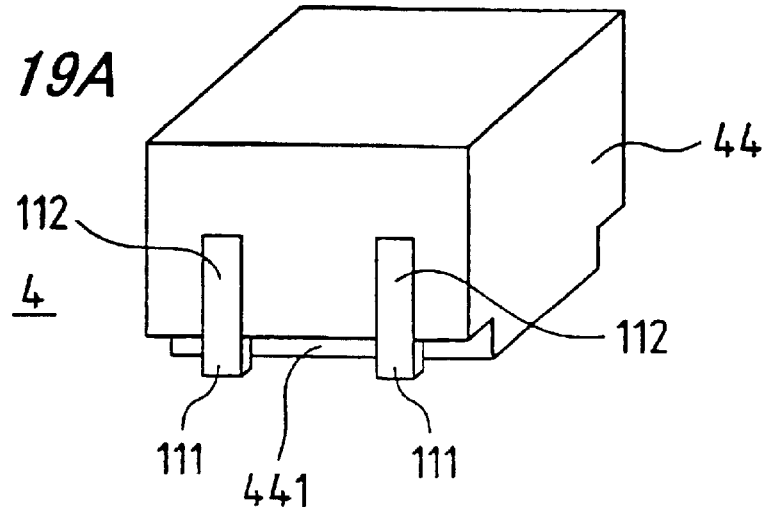
FIG. 19A is a schematic perspective view of the photocoupler having a concave portion of the second embodiment, as is viewed from above
Figure 19B:
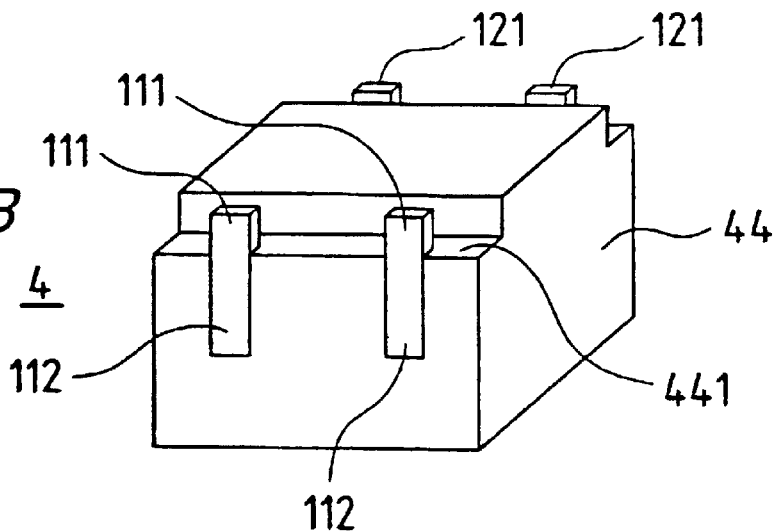
FIG. 19B is a schematic perspective view of the photocoupler having a concave portion of the second embodiment, as is viewed from below.

After the formation of the mold space C, a light-shading resin is injected into the mold space C from the resin injection gate of the upper fixing mold 211. With the injection of the light-shading resin, a secondary mold body 44 is formed in the mold space C. Thus, a photocoupler 4 as shown in FIGS. 19A and 19B is fabricated. The series of fabrication process steps is terminated in step S17.

The thus-fabricated photocoupler 4 has concave portions 441 along the opposite sides of the bottom surface thereof as shown in FIGS. 19A and 19B. The top ends 111 and 121 of the lead frames 11 and 12 protrude from the concave portions 441. FIGS. 19A and 19B are schematic perspective views of the photocoupler 4 having the concave portions 441, as is viewed from above and below, respectively.

The lead frames 11 and 12 can be soldered to an object on which the photocoupler 4 is mounted, in the concave portions 441, to mount the photocoupler 4 on the object. This eliminates the necessity of securing a space for soldering on the object separately. As a result, the mount area required to mount the photocoupler 4 on the object can be reduced.

<Third Embodiment>

The third embodiment is the same as the first embodiment described above except for the lower lead frame pinch mold 222 of the apparatus 2. Therefore, the same components as those in the first embodiment are denoted by the same reference numerals, and the description thereof is omitted here.

Figure 20:
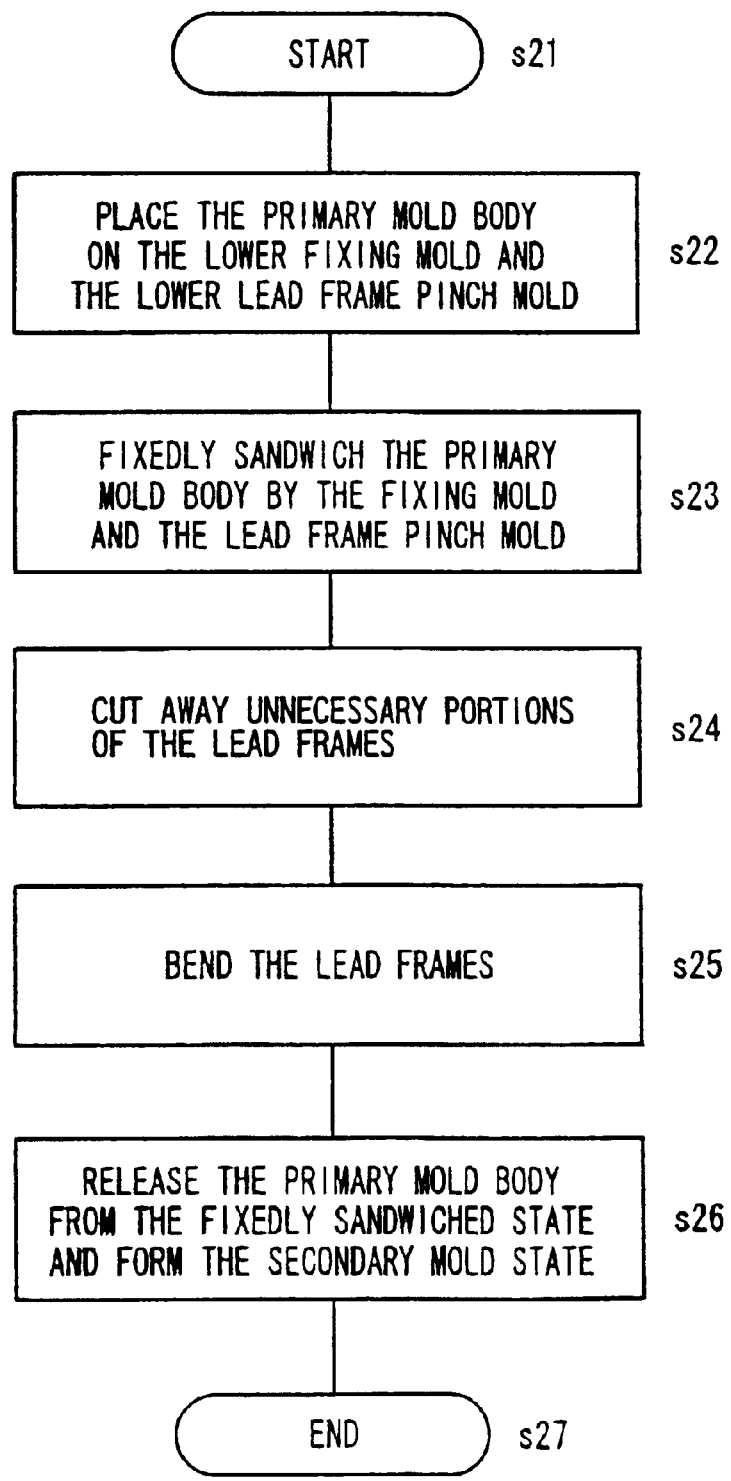
FIG. 20 is a flowchart of a fabrication process of a photocoupler of the third embodiment of the invention.
Figure 21:
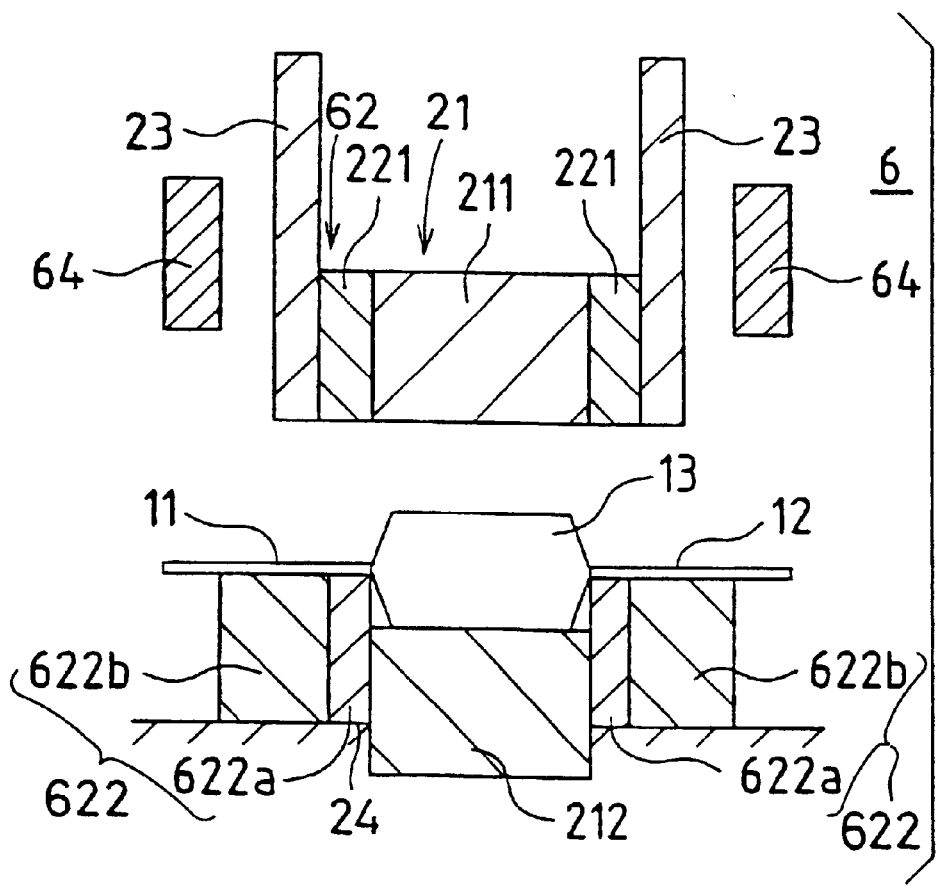
FIG. 21 is a cross-sectional view of a fabrication apparatus, showing process step 1 of the fabrication process of the photocoupler of the third embodiment of the invention.

The primary mold body 13 with the pair of protruding lead frames 11 and 12 is placed in an apparatus 6 shown in FIGS. 21, 22, 23, 24 and 25. FIG. 20 is a flowchart of a fabrication process of the photocoupler of the third embodiment of the invention. FIGS. 21, 22, 23, 24 and 25 are cross-sectional views of the apparatus 6, showing sequential process steps 1 to 5 of the fabrication process of the photocoupler of this embodiment.

The apparatus 6 includes a fixing mold 21 for fixing the primary mold body 13, a lead frame pinch mold 62 for pinching the lead frames 11 and 12, a bending mold 23 for bending the lead frames 11 and 12, and cutting means for cutting away unnecessary portions of the lead frames 11 and 12.

The lead frame pinch mold 62, which is constructed of two parts, is composed of an upper lead frame pinch mold 221 and a lower lead frame pinch mold 622, and is placed on both sides of the fixing mold 21. The lower lead frame pinch mold 622 is composed of a lower inner lead frame pinch mold 622a having substantially the same construction as the lower lead frame pinch mold 222 in the first embodiment and a lower outer lead frame pinch mold 622b placed on the outer sides of the lower inner lead frame pinch mold 622a. The upper lead frame pinch mold 221, the lower inner lead frame pinch mold 622a, and the lower outer lead frame pinch mold 622b are all vertically movable.

The cutting means, which is composed of two cutting parts 64, is placed on the outer sides of the lower lead frame pinch mold 622. The cutting parts 64 are vertically movable.

The fabrication process of a photocoupler with the apparatus 6 will be described in detail.

In step S21 in FIG. 20, fabrication of the photocoupler is started. In step S22 as process step 1 shown in FIG. 21, the primary mold body 13 with the pair of protruding lead frames 11 and 12 is placed on the lower fixing mold 212 and the lower lead frame pinch mold 622.

In step S23 as process step 2, once the primary mold body 13 is placed, the upper fixing mold 211 is lowered, to fixedly sandwich the primary mold body 13 between the upper and lower fixing molds 211 and 212. The upper lead frame pinch mold 221 is also lowered, to fixedly pinch the base ends of the lead frames 11 and 12 between the upper and lower lead frame pinch molds 221 and 622. After the fixing of the primary mold body 13 by the fixing mold 21 and the pinching of the lead frames 11 and 12 by the lead frame pinch mold 62, the cutting parts 64 are lowered.

Figure 22:
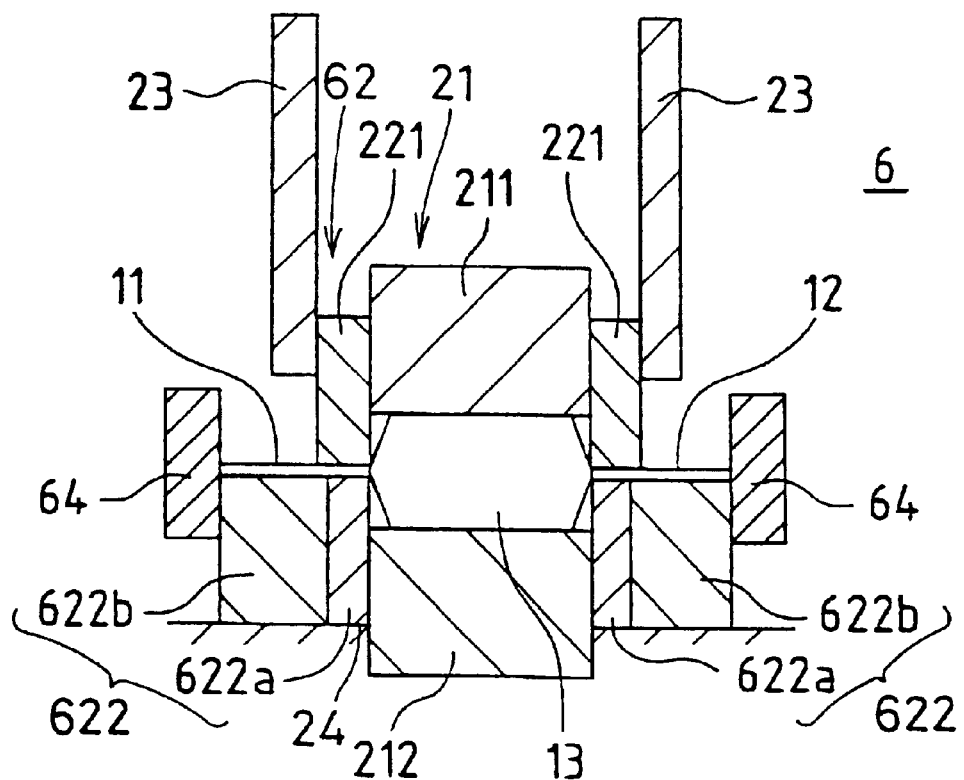
FIG. 22 is a cross-sectional view of a fabrication apparatus, showing process step 2 of the fabrication process of the photocoupler of the third embodiment of the invention.
Figure 23:
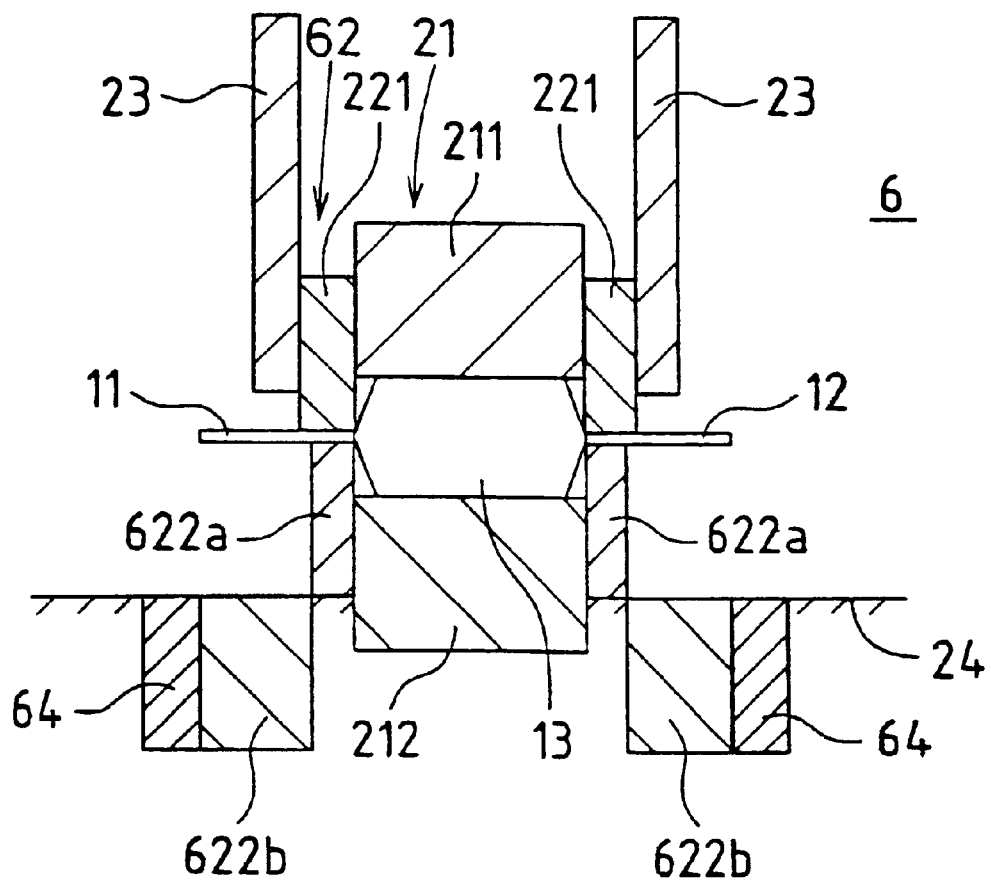
FIG. 23 is a cross-sectional view of a fabrication apparatus, showing process step 3 of the fabrication process of the photocoupler of the third embodiment of the invention.

In step S24 as process step 3, by the lowering of the cutting parts 64, terminal portions of the lead frames 11 and 12 located right under the cutting parts 64 are cut away as shown in FIG. 22. After this cutting, the cutting parts 64 and the lower outer lead frame pinch mold 622b are lowered as shown in FIG. 23. By this lowering, the cutting parts 64 and the lower outer lead frame pinch mold 622b are kept from protruding from the reference plane 24.

Figure 24:
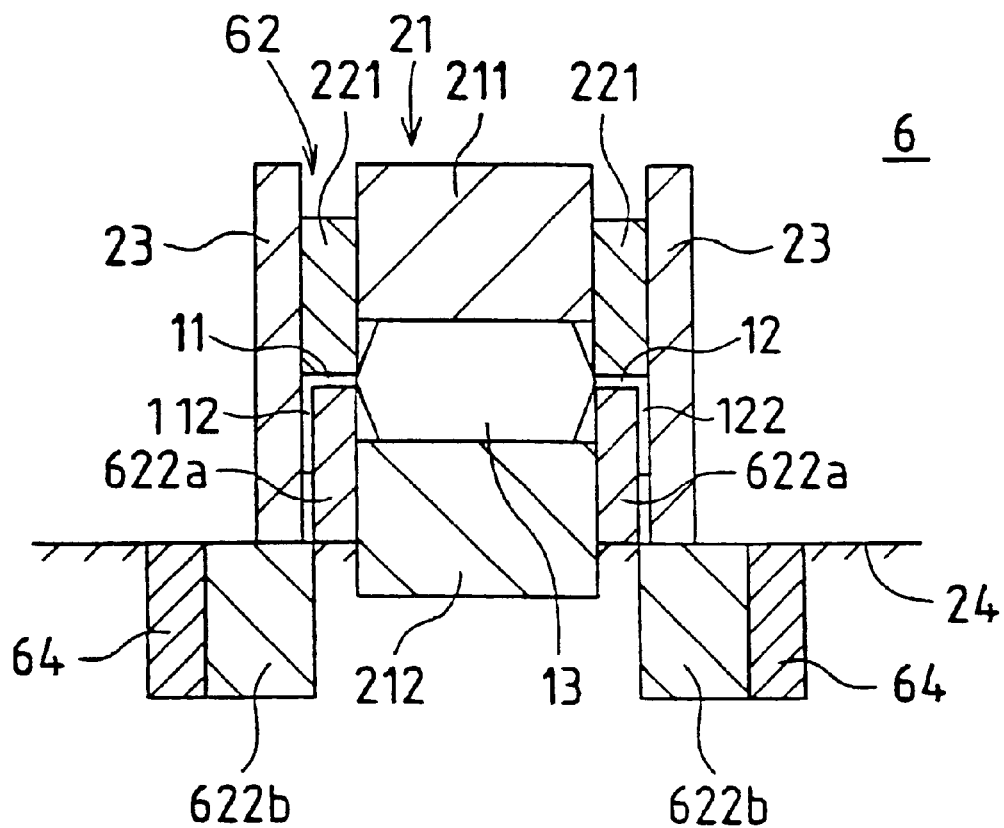
FIG. 24 is a cross-sectional view of a fabrication apparatus, showing process step 4 of the fabrication process of the photocoupler of the third embodiment of the invention.

In step S25 as process step 4, after the lowering of the cutting parts 64 and the lower outer lead frame pinch mold 622b, the bending mold 23 is lowered. By the lowering of the bending mold 23, as shown in FIG. 24, the lead frames 11 and 12 pinched by the lead frame pinch mold 62 are bent along the outer sides of the two parts of the lower inner lead frame pinch mold 622a.

Figure 25:
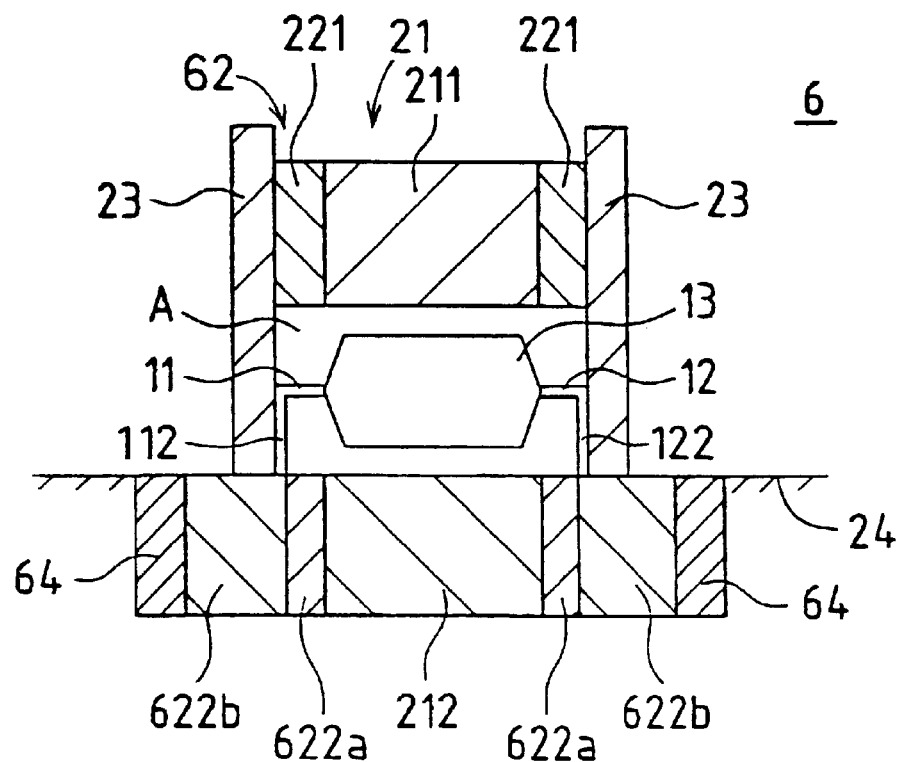
FIG. 25 is a cross-sectional view of a fabrication apparatus, showing process step 5 of the fabrication process of the photocoupler of the third embodiment of the invention.

In step S26 as process step 5, after the bending of the lead frames 11 and 12, as shown in FIG. 25, the lower fixing mold 212 and the lower inner lead frame pinch mold 622a are lowered, so that the surface of the lower fixing mold 212 in contact with the primary mold body 13 and the faces of the lower inner lead frame pinch mold 622a in contact with the lead frames 11 and 12 are flush with the reference plane 24. By this lowering, the primary mold body 13 with the pair of protruding lead frames 11 and 12 is released from the vertically sandwiched fixed state, and the mold space A is formed inside the apparatus 6. The top ends of the lead frames 11 and 12 drop until they reach the reference plane 24.

Once the top ends of the lead frames 11 and 12 reach the reference plane 24, a light-shading resin is injected into the mold space A from the resin injection gate of the upper fixing mold 211. With the injection of the light-shading resin, a second mold body 14 is formed in the mold space A. Thus, a photocoupler 1 similar to the photocoupler of the first embodiment as shown in FIGS. 8A and 8B is fabricated. The series of fabrication process steps is terminated in step S27.

As described above, in the photocoupler 1 fabricated by the fabrication process described above, not only the top ends 111 and 121, but also the terminal portions 112 and 122 of the lead frames 11 and 12 are exposed at the surfaces of the secondary mold body 14. That is, the terminal portions 112 and 122 of the lead frames 11 and 12 are not covered with the secondary mold body 14, and thus the molding amount of the secondary mold body 14 can be minimized. As a result, the mount area required to mount the photocoupler 1 on an object can be reduced.

Moreover, with the cutting parts 64 for cutting away unnecessary portions of the lead frames 11 and 12, the length of the lead frames 11 and 12 can be shortened according to a desired shape of the secondary mold body 14. This enables fabrication of the photocoupler 1 with the mount area reduced according to the shape of an object on which the photocoupler is mounted. In addition, the photocoupler 1 can be easily fabricated with good precision with no protrusion of unnecessary portions of the lead frames 11 and 12 from the resultant secondary mold body 14.

The thus-fabricated photocoupler 1 is tested for operations of its components such as the light-receiving device 15 and the light-emitting device 16. During the testing of the photocoupler 1 of the third embodiment, it is possible to perform not only individual testing of each photocoupler 1, but also batch testing of a plurality of photocouplers at a time.

Figure 26:
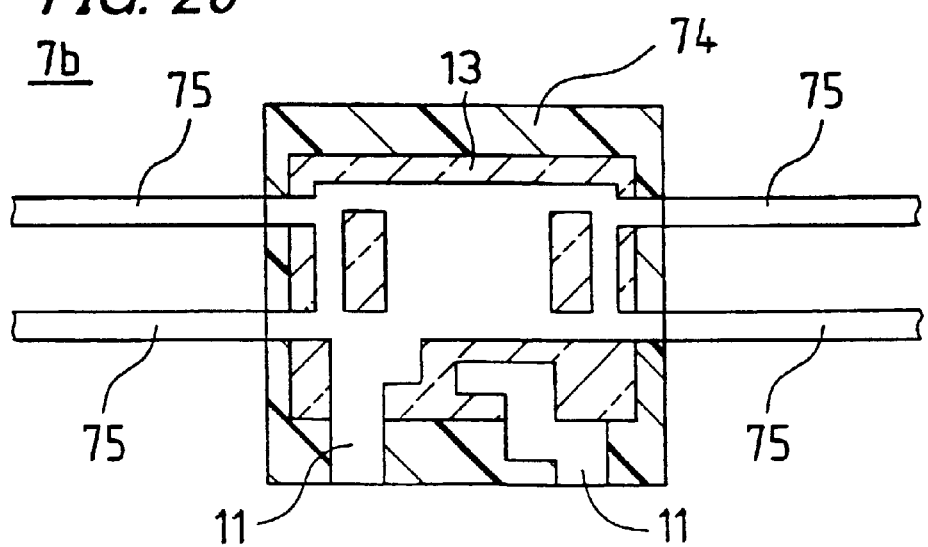
FIG. 26 is a cross-sectional plan view of a photocoupler having a suspension pin of the third embodiment of the invention.

For example, in the batch testing of a plurality of photocouplers at a time, a suspension pin 75 is provided for the photocouplers as shown in FIG. 26. FIG. 26 is a cross-sectional plan view of a photocoupler 7b provided with the suspension pin 75.

The suspension pin 75 is connected with the pair of lead frames 11 and 12 to cross each other. The suspension pin 75 connected with the lead frames 11 and 12 is embedded in the primary mold body 73 and the secondary mold body 74 and made to protrude from the secondary mold body 74, according to the fabrication process of the third embodiment of the invention. In this way, the photocoupler 7b is fabricated.

The suspension pin 75 protruding from the secondary mold body 74 is also connected with pairs of lead frames 11 and 12 of other photocouplers to cross each other. In this way, other photocouplers 7a and 7c are fabricated with the fabrication process of the third embodiment of the invention.

Figure 27:
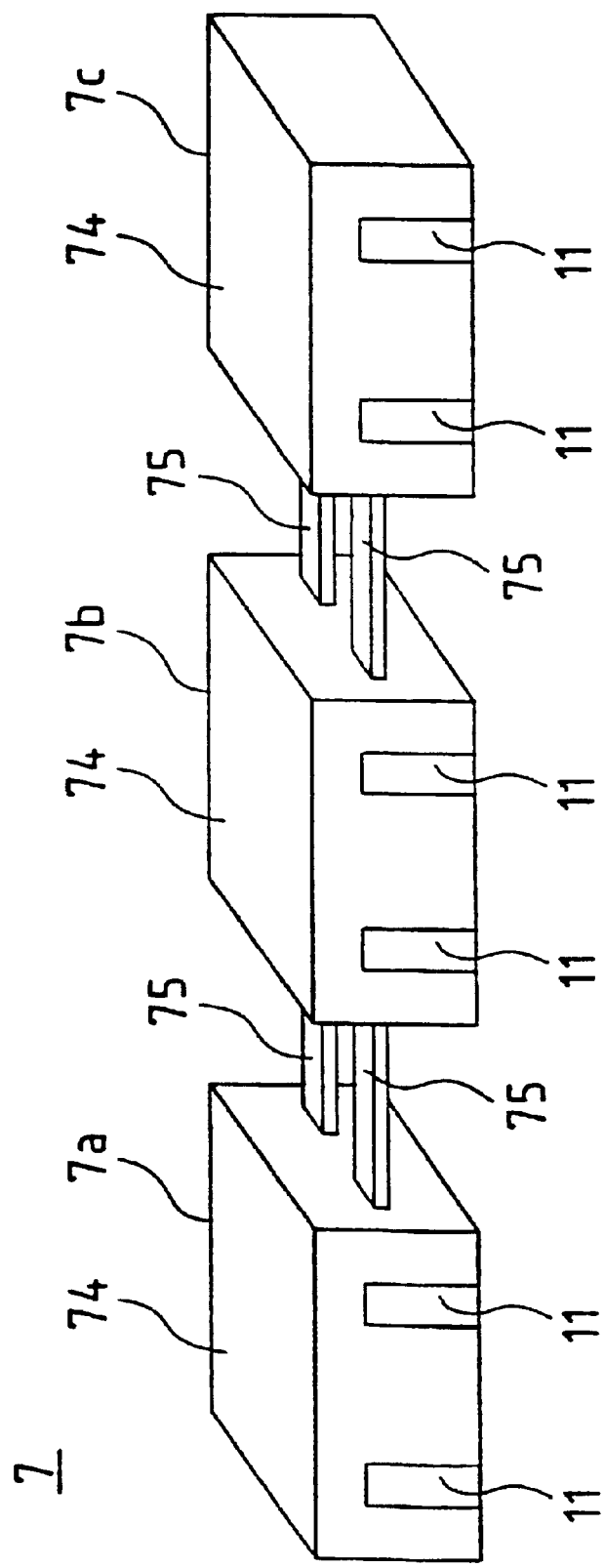
FIG. 27 is a perspective view of a plurality of photocouplers having a suspension pin sequentially connected with the suspension pin of the third embodiment of the invention.

As shown in FIG. 27, the thus-fabricated plurality of photocouplers 7 (an assembly consisting of the photocouplers 7a, 7b and 7c) are sequentially connected via the suspension pin 75. FIG. 27 is a perspective view of a plurality of photocouplers 7 sequentially connected via the suspension pin 75.

During the testing of the photocoupler 7b described above, the other photocouplers 7a and 7c connected via the suspension pin 75 are also tested simultaneously. After the testing, the plurality of photocouplers 7 are separated from one another by cutting away the suspension pin 75, into the individual photocouplers 7a, 7b and 7c, to thereby complete testing on operations of components of the photocouplers.

As described above, the suspension pin 75 is provided for the lead frames 11 and 12. By extending the suspension pin 75 outside from headers of the lead frames 11 and 12 of each of the photocouplers 7a, 7b and 7c, to connect the photocouplers 7a, 7b and 7c sequentially, simultaneous testing of a plurality of photocouplers 7 is possible. After completion of the testing, the plurality of photocouplers 7 can be simultaneously recovered as shown in FIG. 27.

By providing the suspension pin 75 for the plurality of photocouplers 7, one step of cutting away the suspension pin 75 is additionally required for the fabrication process. However, by providing the suspension pin 75, it becomes possible to test GND and cathodes of the light-receiving devices and the light-emitting devices of the plurality of photocouplers 7 at a time during the testing of the plurality of photocouplers 7, and thus the testing is facilitated.

In this embodiment, the suspension pin 75 was provided for the lead frames for simultaneous testing of the plurality of photocouplers 7. Alternatively, flashes between the secondary mold bodies 74 may be used.

In the above case, the plurality of photocouplers can be placed in a tester simultaneously, and can be separated into the individual photocouplers easily by gate breaking after completion of the testing.

Figure 28:
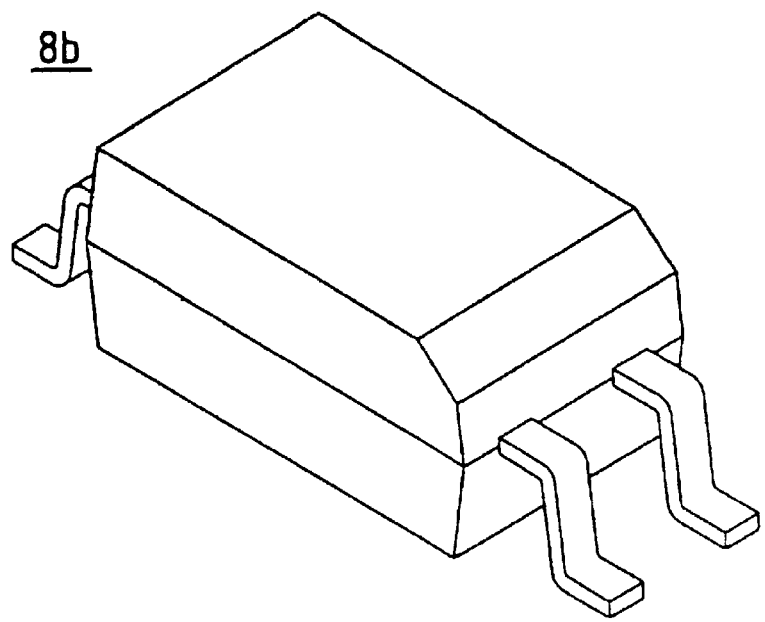
FIG. 28 is a perspective view of a conventional photocoupler.
Figure 29:
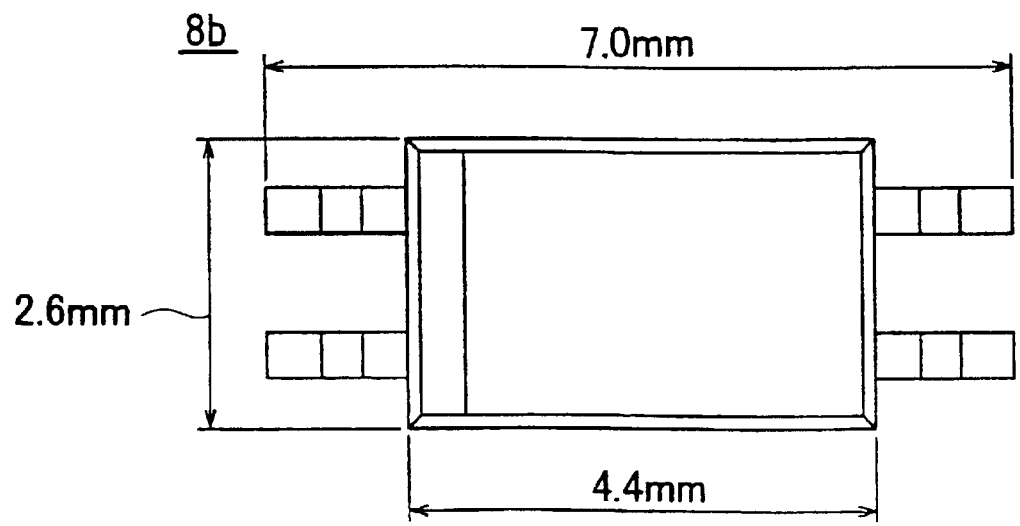
FIG. 29 is a plan view of the conventional photocoupler, as is viewed from above.
Figure 30:
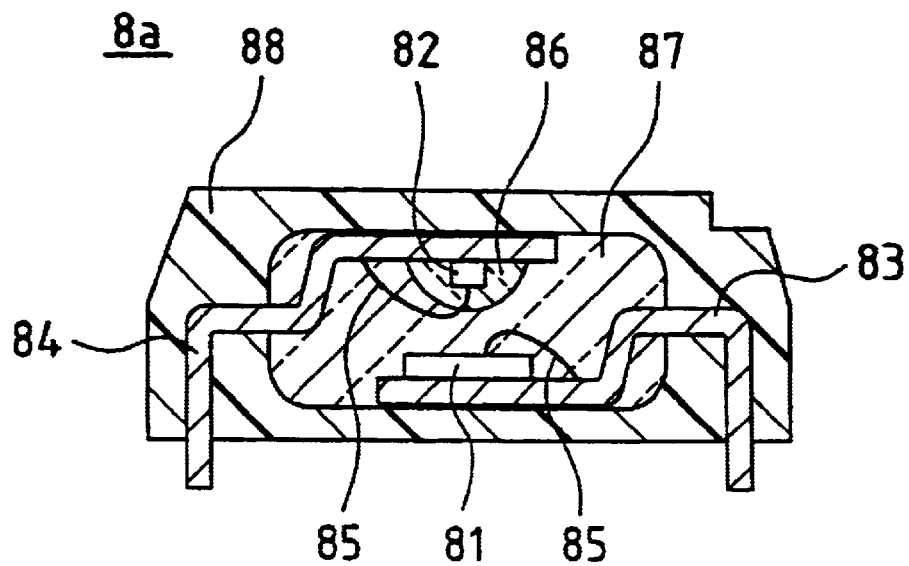
FIG. 30 is a cross-sectional side view of another conventional photocoupler.
Figure 31:
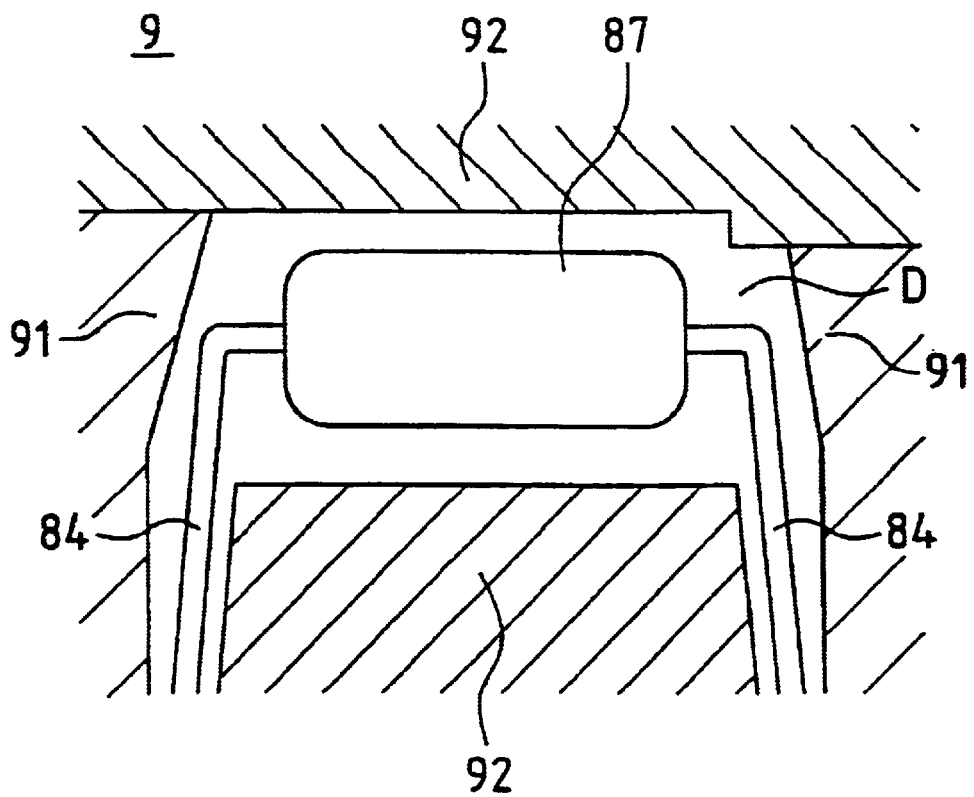
FIG. 31 is a schematic side view of a conventional photocoupler fabrication apparatus.

The size of the photocoupler 1 of the first embodiment was measured, and the results are shown in FIG. 8A. For comparison, the size of a conventional photocoupler 8b shown in FIGS. 28 and 29 was measured. The comparison results will be described in detail with reference to FIGS. 28 and 29. FIGS. 28 and 29 are a perspective view and a plan view as is viewed from above, respectively, of the conventional photocoupler 8b. Unlike the conventional photocoupler 8a described above, the conventional photocoupler 8b is used to show the size for actual comparison with the photocoupler 1. The size is therefore shown merely as reference.

The case size of the conventional photocoupler 8b is 7.0 mm×2.6 mm by actual measurement as shown in FIG. 29, and the case size of the photocoupler 1 of the first embodiment is 5.5 mm×2.6 mm as shown in FIG. 8A.

From the above results, it is found that the case size of the photocoupler 1 of the first embodiment is smaller by about 21% than the case size of the conventional photocoupler 8b.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A photocoupler comprising:
   a pair of lead frames having terminal portions extending therefrom;
   a light-emitting device placed on one of the pair of lead frames;

a transparent body placed on the light-emitting device;

a light-receiving device placed on the other lead frame for receiving light emitted from the light-emitting device;

a primary mold body made of a light transparent resin for covering the light-emitting device and covering the light-receiving device, said primary mold body partially covering the pair of lead frames with the terminal portions uncovered and exposed; and a secondary mold body made of a light-shading resin for covering the primary mold body, wherein the pair of lead frames are bent in the secondary mold body, and outer side faces of the terminal portions ranging from the bent positions to top ends of the lead frames are conformed with the secondary mold body and exposed at surfaces.

2. The photocoupler of claim 1, wherein the secondary mold body has a concave portion, and a top end of the terminal portion protrudes from the concave portion.

3. The photocoupler of claim 1, wherein a thermoplastic resin is used as the light-shading resin.

4. A photocoupler fabrication apparatus for fabricating the photocoupler of claim 1, comprising:

a pair of fixing molds for fixedly sandwiching the primary mold body therebetween vertically;

a pair of lead frame pinch molds placed on both sides of the fixing molds for pinching base ends of the pair of lead frames; and a bending mold placed on outer sides of the lead frame pinch molds for bending the pair of lead frames fixedly pinched by the lead frame pinch molds, wherein the pair of fixing molds, the pair of lead frame pinch molds and the bending mold define a mold space for the secondary mold body.

5. The photocoupler fabrication apparatus of claim 4, wherein correction means for correcting a position of the primary mold body with the bent lead frames in the mold space is provided.

6. The photocoupler fabrication apparatus of claim 4, wherein the lead frame pinch mold is allowed to protrude in the mold space during the molding of the second mold body.

7. The photocoupler fabrication apparatus of claim 4, wherein concave grooves for allowing the pair of bent lead frames to fit therein are formed on the lead frame pinch molds, and the lead frame pinch molds is permitted to protrude in the mold space in molding the secondary mold body so that top ends of the pair of lead frames fit in the concave grooves.

8. The photocoupler fabrication apparatus of claim 4, wherein cutting means for cutting away unnecessary portions of the pair of lead frames is placed on the outer sides of the bending mold.

9. A method for fabricating the photocoupler of claim 1, comprising the steps of:

fixing the primary mold body by vertically sandwiching the primary mold body between the pair of lead frames;

bending the pair of lead frames in a predetermined direction while pinching base portions of the lead frames;

releasing the primary mold body from the vertically sandwiched fixed state to form a mold space; and injecting a light-shading resin into the mold space, to form the secondary mold body.

10. The method for fabricating the photocoupler of claim 9, further comprising the step of:

correcting, prior to the injection of the light-shading resin into the mold space, a position of the primary mold body with the bent lead frames in the mold space.

11. The method for fabricating the photocoupler of claim 9, further comprising the step of:

making, prior to the injection of the light-shading resin into the mold space, part of faces defining the mold space to protrude in the mold space.

12. The method for fabricating the photocoupler of claim 9, further comprising the step of:

cutting away, prior to the bending of the lead frames, unnecessary portions of the lead frames.

* * * * *